(12) United States Patent
Ohta et al.

(10) Patent No.: US 11,581,698 B2
(45) Date of Patent: Feb. 14, 2023

(54) OPTICAL DEVICE, LIGHTING APPARATUS, MEASURING APPARATUS, PART-INSPECTING APPARATUS, ROBOT, ELECTRONIC DEVICE, AND MOVABLE OBJECT

(71) Applicants: Yusuke Ohta, Kanagawa (JP); Toshiyuki Ikeoh, Düsseldorf (DE); Atsushi Sakai, Tokyo (JP)

(72) Inventors: Yusuke Ohta, Kanagawa (JP); Toshiyuki Ikeoh, Düsseldorf (DE); Atsushi Sakai, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 340 days.

(21) Appl. No.: 16/818,134

(22) Filed: Mar. 13, 2020

(65) Prior Publication Data
US 2020/0303896 A1 Sep. 24, 2020

(30) Foreign Application Priority Data

Mar. 18, 2019 (JP) .............................. JP2019-050442
Mar. 4, 2020 (JP) .............................. JP2020-037228

(51) Int. Cl.
*H01S 5/02253* (2021.01)
*H01S 5/183* (2006.01)
(Continued)

(52) U.S. Cl.
CPC ......... *H01S 5/02253* (2021.01); *B25J 19/022* (2013.01); *G01N 21/88* (2013.01); *G01S 17/02* (2013.01); *H01S 5/02257* (2021.01); *H01S 5/18361* (2013.01); *H01S 5/18388* (2013.01); *H01S 5/34313* (2013.01); *H01S 5/34353* (2013.01); *H01S 5/423* (2013.01)

(58) Field of Classification Search
CPC ............. H01S 5/02253; H01S 5/02257; H01S 5/18361; H01S 5/18388; H01S 5/34313; H01S 5/34353; H01S 5/423; B25J 19/022; G01N 21/88; G01S 17/02
See application file for complete search history.

(56) References Cited

U.S. PATENT DOCUMENTS

| | | | |
|---|---|---|---|
| 2005/0025211 A1* | 2/2005 | Zhang | H01S 5/423 372/101 |
| 2011/0057204 A1* | 3/2011 | Morioka | G02B 6/4214 257/E33.077 |

(Continued)

FOREIGN PATENT DOCUMENTS

| | | |
|---|---|---|
| JP | 5-055703 | 3/1993 |
| JP | 2006-179747 | 7/2006 |

(Continued)

*Primary Examiner* — Yuanda Zhang
(74) *Attorney, Agent, or Firm* — IPUSA, PLLC

(57) ABSTRACT

An optical device includes: a substrate having a first surface, and a second surface opposite of the first surface; a plurality of surface emitting laser elements provided on the first surface of the substrate and configured to emit light in a direction intersecting the first surface; a plurality of optical elements disposed on the second surface so as to respectively correspond to the plurality of surface emitting laser elements; and an anti-reflection structure between the substrate and the plurality of optical elements.

18 Claims, 33 Drawing Sheets

(51) Int. Cl.
*H01S 5/343* (2006.01)
*B25J 19/02* (2006.01)
*H01S 5/42* (2006.01)
*G01S 17/02* (2020.01)
*G01N 21/88* (2006.01)
*H01S 5/02257* (2021.01)

(56) References Cited

U.S. PATENT DOCUMENTS

| | | | |
|---|---|---|---|
| 2012/0147912 A1* | 6/2012 | Moench | H01S 5/1021 |
| | | | 372/50.1 |
| 2018/0198254 A1* | 7/2018 | Tatum | H01S 5/18391 |
| 2018/0226764 A1 | 8/2018 | Hagita et al. | |
| 2020/0067278 A1* | 2/2020 | Han | H01S 5/02415 |
| 2020/0166768 A1* | 5/2020 | Yoneda | H01S 5/423 |
| 2020/0194973 A1* | 6/2020 | Bloemen | H01S 5/18388 |

FOREIGN PATENT DOCUMENTS

| | | | |
|---|---|---|---|
| JP | 2008-124287 | 5/2008 | |
| JP | 2014-192166 | 10/2014 | |
| JP | 2019-165198 | 9/2019 | |
| WO | WO-2019181757 A1 * | 9/2019 | G01S 17/42 |

* cited by examiner

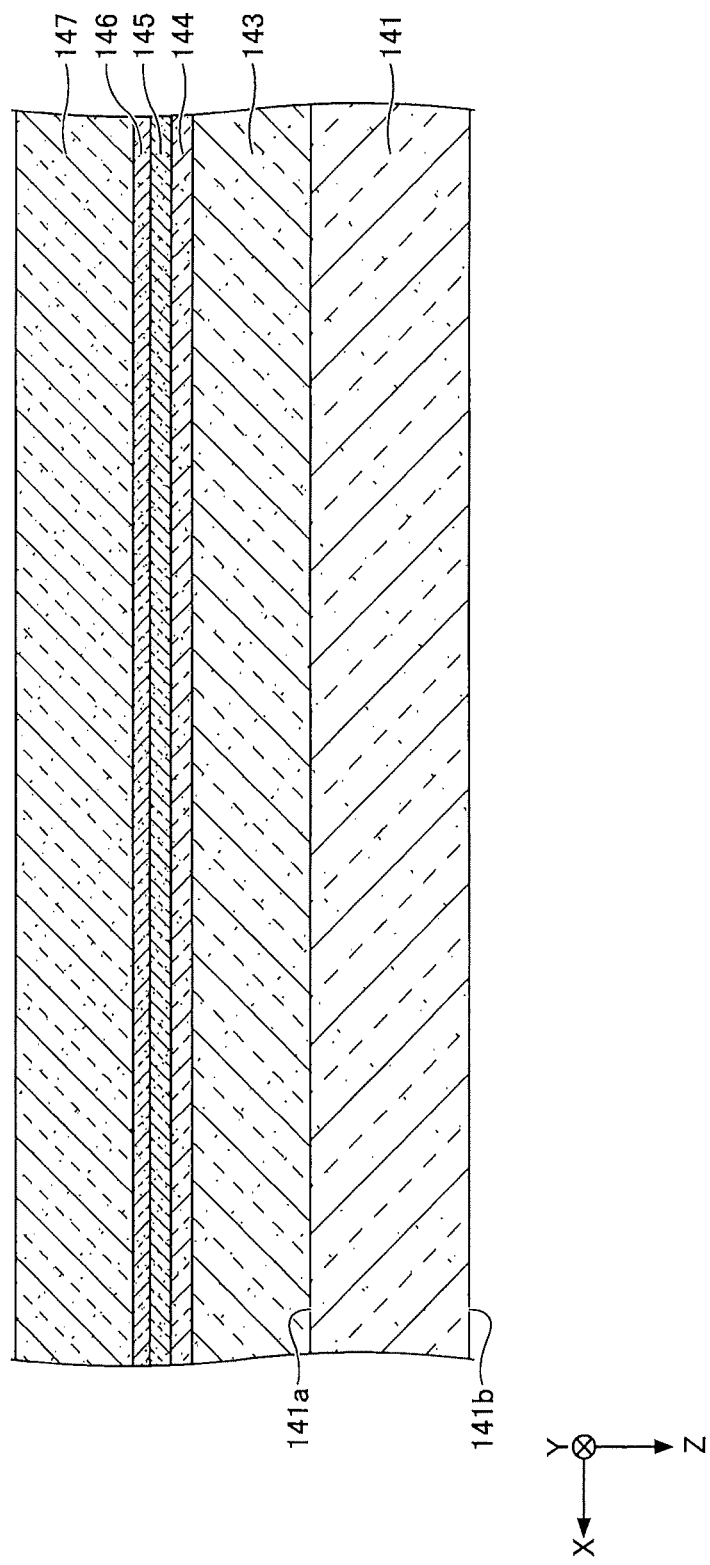

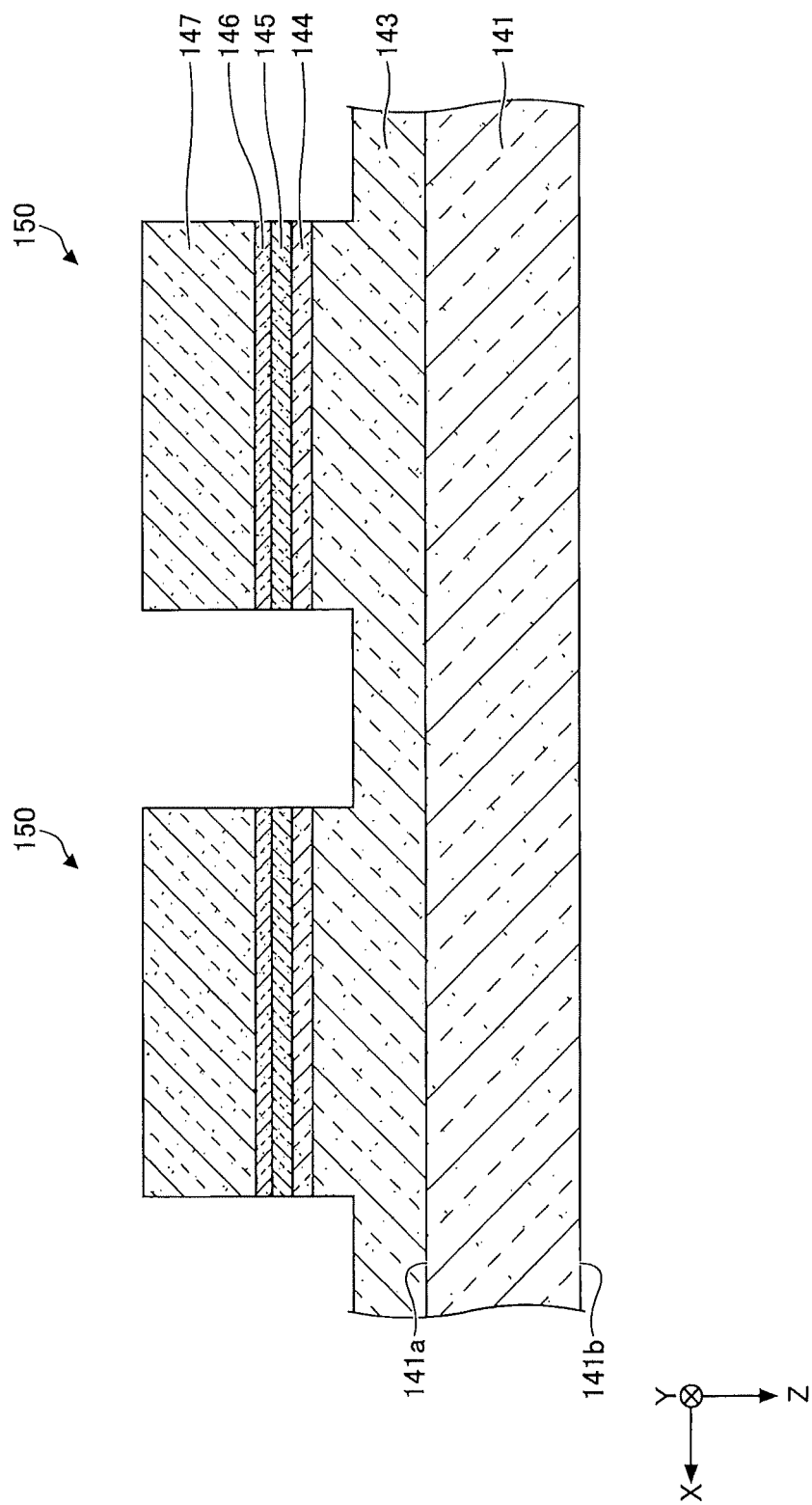

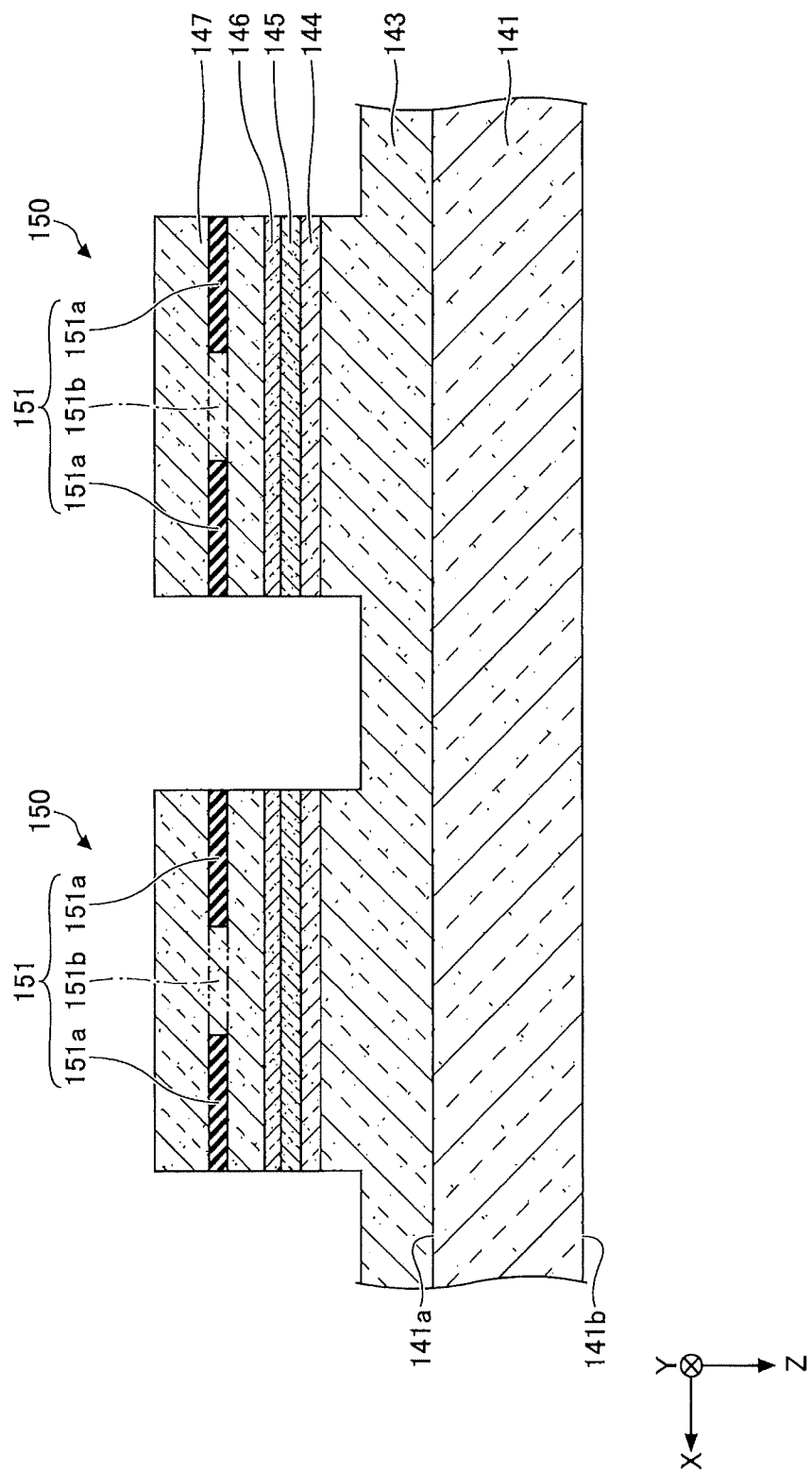

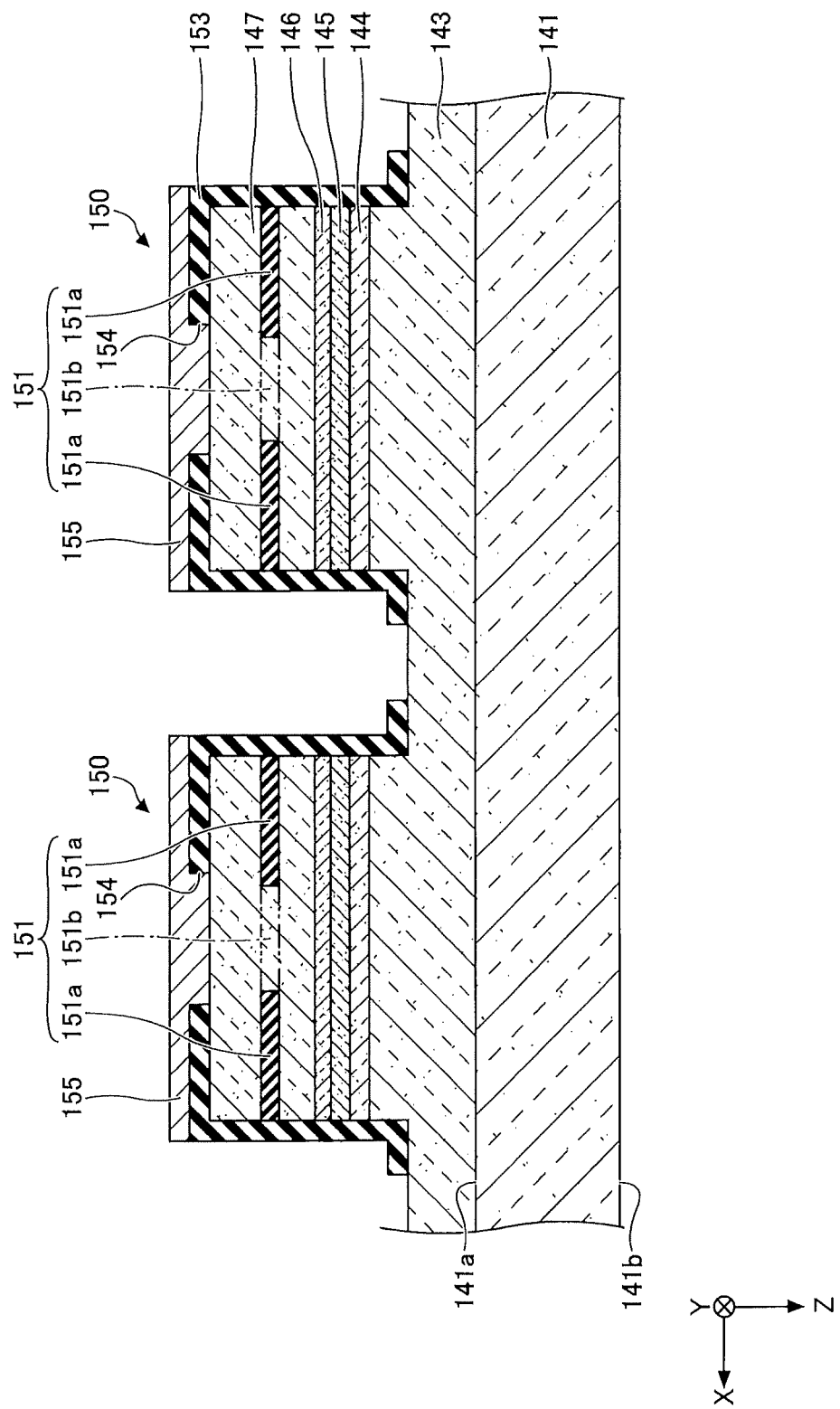

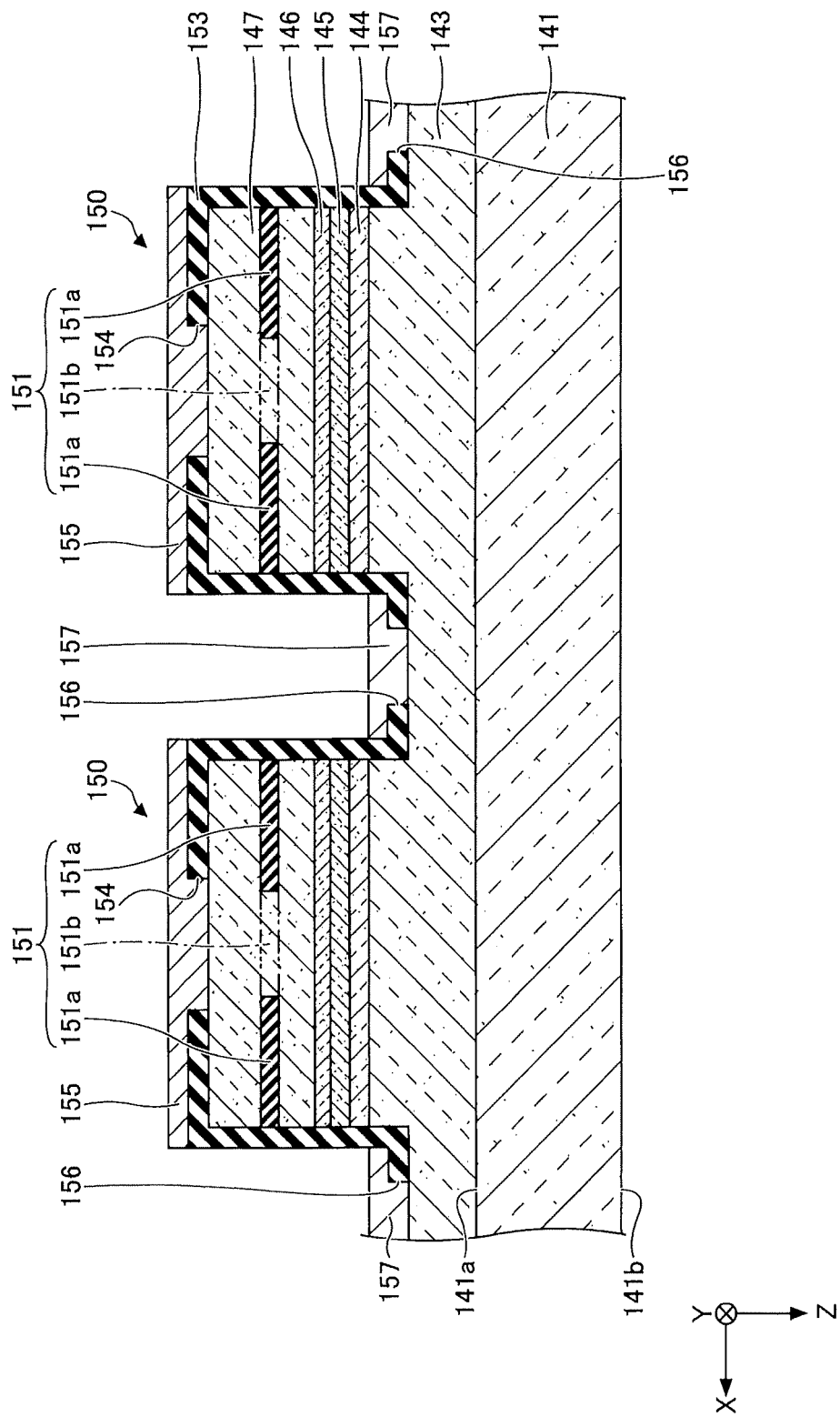

OPTICAL DEVICE, LIGHTING APPARATUS, MEASURING APPARATUS, PART-INSPECTING APPARATUS, ROBOT, ELECTRONIC DEVICE, AND MOVABLE OBJECT

CROSS-REFERENCE TO RELATED APPLICATIONS

This patent application is based on and claims priority pursuant to 35 U.S.C. § 119(a) to Japanese Patent Application Nos. 2019-050442, filed on Mar. 18, 2019, and 2020-037228, filed on Mar. 4, 2020, in the Japan Patent Office, the entire disclosure of which is hereby incorporated by reference herein.

BACKGROUND

Technical Field

The present invention relates to an optical device, a lighting apparatus, a measuring apparatus, a part-inspecting apparatus, a robot, an electronic device, and a movable object.

Description of the Related Art

Vertical cavity surface emitting laser (VCSEL) elements are expected to be applied to high-power laser light sources because the temperature dependence of the oscillation wavelength is small. Furthermore, since an arrangement of VCSEL elements in a two-dimensional array is easy, VCSEL elements are suitable for three-dimensional scanning with laser light. In addition, a VCSEL chip including multiple laminated VCSEL elements has been developed as a high-power laser light source or a light source for three-dimensional laser scanning.

However, regarding a VCSEL chip, the emission angle of the laser light emitted from each VCSEL element is large. For this reason, a surface emitting laser having a micro-lens formed on a substrate of a VCSEL chip has been proposed.

Nonetheless, regarding the above-described surface emitting laser, it is difficult to fabricate the micro-lens with high precision, and it is difficult to sufficiently reduce the emission angle.

SUMMARY

Example embodiments include an optical device including: a substrate having a first surface, and a second surface opposite of the first surface; a plurality of surface emitting laser elements provided on the first surface of the substrate and configured to emit light in a direction intersecting the first surface; a plurality of optical elements disposed on the second surface so as to respectively correspond to the plurality of surface emitting laser elements; and an anti-reflection structure between the substrate and the plurality of optical elements.

BRIEF DESCRIPTION OF THE SEVERAL VIEWS OF THE DRAWINGS

A more complete appreciation of the disclosure and many of the attendant advantages and features thereof can be readily obtained and understood from the following detailed description with reference to the accompanying drawings, wherein:

FIG. 4A is a cross-sectional view illustrating a method for manufacturing the optical device according to the first embodiment;

FIG. 4B is a cross-sectional view illustrating a method for manufacturing the optical device according to the first embodiment;

FIG. 4C is a cross-sectional view illustrating a method for manufacturing the optical device according to the first embodiment;

FIG. 4E is a cross-sectional view illustrating a method for manufacturing the optical device according to the first embodiment;

FIG. 4F is a cross-sectional view illustrating a method for manufacturing the optical device according to the first embodiment;

Figure 1:
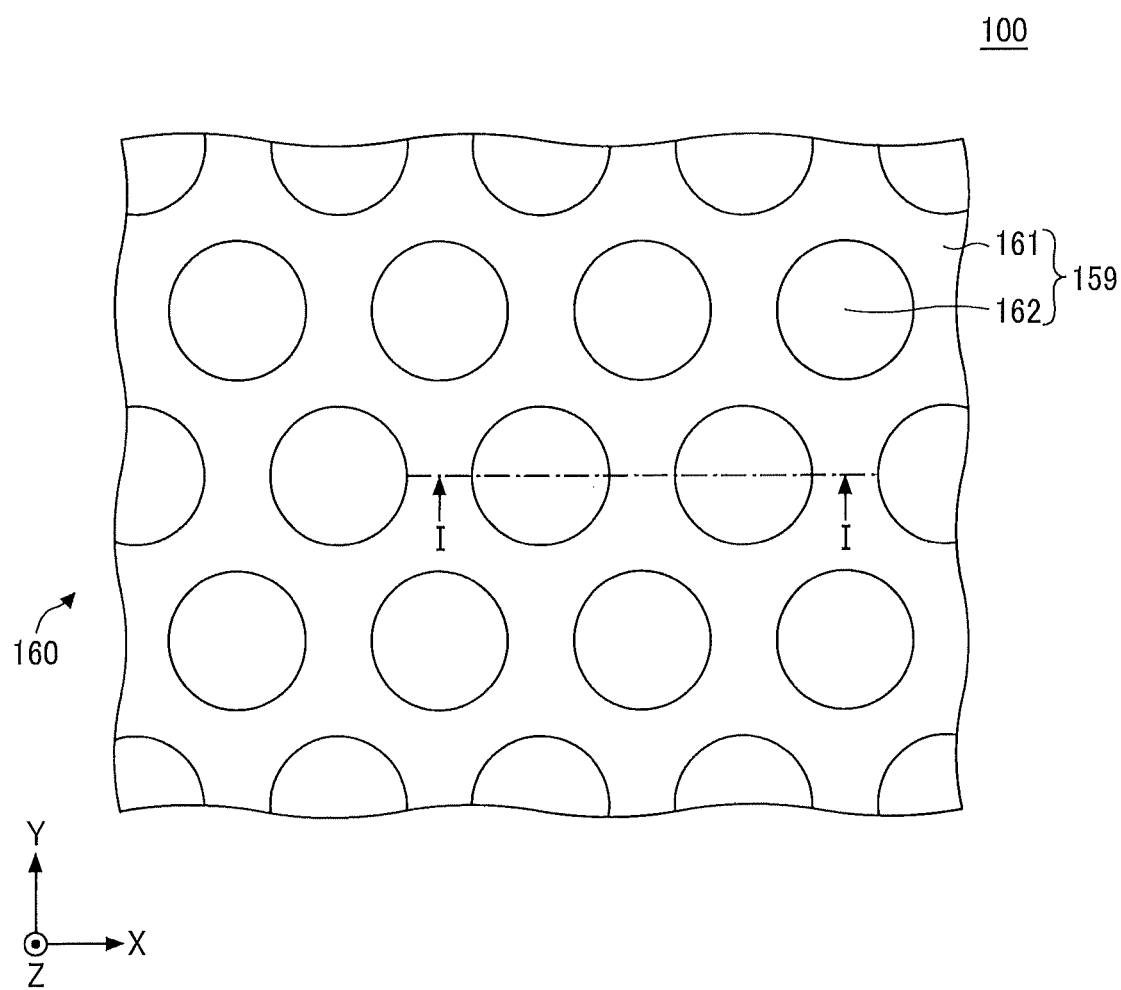
FIG. 1 is a plan view illustrating an optical device according to the first embodiment.

The accompanying drawings are intended to depict embodiments of the present invention and should not be interpreted to limit the scope thereof. The accompanying drawings are not to be considered as drawn to scale unless explicitly noted.

DETAILED DESCRIPTION

The terminology used herein is for the purpose of describing particular embodiments only and is not intended to be limiting of the present invention. As used herein, the singular forms "a", "an" and "the" are intended to include the plural forms as well, unless the context clearly indicates otherwise.

In describing embodiments illustrated in the drawings, specific terminology is employed for the sake of clarity. However, the disclosure of this specification is not intended to be limited to the specific terminology so selected and it is to be understood that each specific element includes all technical equivalents that have a similar function, operate in a similar manner, and achieve a similar result.

Hereinafter, detail descriptions are given of the embodiments of the present disclosure referring to the accompanying drawings. Note that, in the specification and the drawings, components configured to have substantially the same functions are denoted by the same reference signs, so as to omit duplicate descriptions.

First Embodiment

Figure 2:
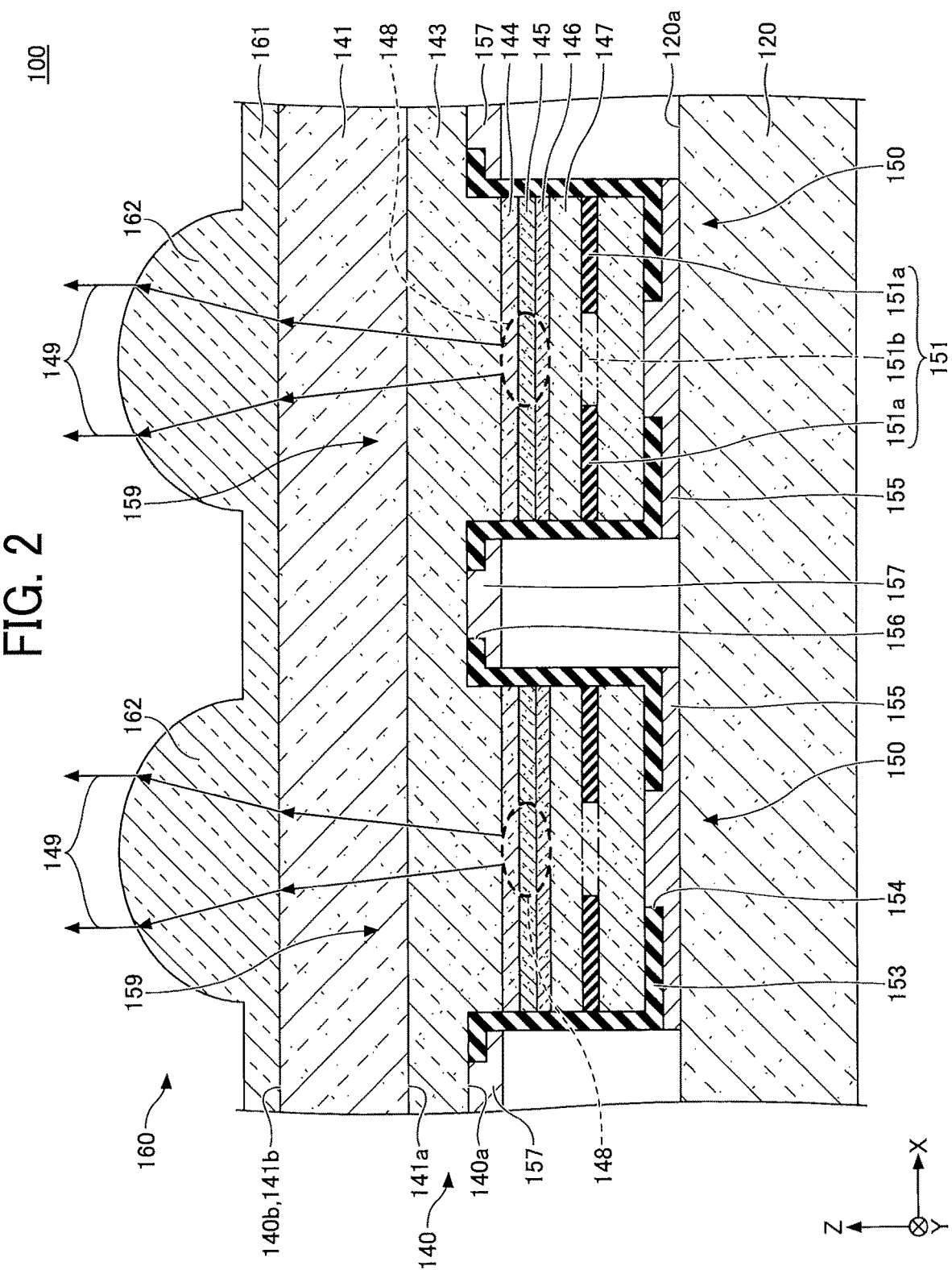
FIG. 2 is a cross-sectional view illustrating the optical device according to the first embodiment.

First, description is given of the first embodiment. The first embodiment relates to an optical device. FIG. 1 is a plan view illustrating the optical device according to the first embodiment. FIG. 2 is a cross-sectional view illustrating the optical device according to the first embodiment. FIG. 2 is the cross-sectional view taken along the I-I line in FIG. 1.

As illustrated in FIG. 1 and FIG. 2, the optical device 100 according to the first embodiment includes the mounting substrate 120, the VCSEL chip 140 mounted on the mounting substrate 120 and including VCSEL elements, and a micro-lens array (MLA) 160 including micro-lenses 162 which the light emitted from the VCSEL elements enter.

In the following description, unless otherwise specified, the direction in which the VCSEL chip 140 is located as viewed from the mounting substrate 120 is defined as upward, and the direction in which the mounting substrate 120 is located as viewed from the VCSEL chip 140 is defined as downward. Note that the optical device 100 can be used upside down and can be arranged at any angle. Furthermore, a planar view refers to viewing a target object from the normal direction of the upper surface 140b of the VCSEL chip 140. Moreover, a planar shape refers to the shape of a target object viewed from the normal direction of the surface 140b of the VCSEL chip 140.

Furthermore, in each of the drawings, the normal direction of the surface 140b of the VCSEL chip 140 is defined as the Z direction, the direction parallel to one side of the surface 140b of the VCSEL chip 140 on a planar view is defined as the X direction, and the direction perpendicular to the X direction and the Z direction is defined as the Y direction.

Structure of the VCSEL Chip 140

Here, description is given of the structure of the VCSEL chip 140. Note that, in the description of the structure of the VCSEL chip 140 and the description of the later-described method for forming the VCSEL chip 140, the direction (−Z direction) in which the mounting substrate 120 is located as viewed from the VCSEL chip 140 is defined as upward.

As illustrated in FIG. 1 and FIG. 2, multiple VCSEL elements 159 are arranged in an array on the surface 140a of the VCSEL chip 140 facing the mounting substrate 120. Each VCSEL element 159 is monolithically fabricated on the substrate 141, which is an n-GaAs substrate, or the like, and the film configuration of each VCSEL element 159 is the same. Each VCSEL element 159 is, for example, a surface emitting laser element having an oscillation wavelength of a 940 nm band (approximately 940 nm±30 nm).

For example, a VCSEL element 159 is formed on the substrate 141, which is an n-GaAs substrate, or the like, and includes an n-distributed bragg reflector (n-DBR) 143, a spacer layer 144, an active layer 145, a spacer layer 146, a p-DBR 147, and a selective oxidation layer 151. The selective oxidation layer 151 includes an oxidized region 151a and a non-oxidized region 151b. The refractive index of the n-GaAs substrate is approximately 3.5.

The n-DBR 143 is formed on the substrate 141. The n-DBR 143 is, for example, a semiconductor multilayer film reflector, which is configured with a laminated multiple n-type semiconductor films. The n-DBR 143 includes, for example, a low refractive index layer made of n-$Al_{0.9}Ga_{0.1}As$ and a high refractive index layer made of n-$Al_{0.2}Ga_{0.8}As$. For example, the n-DBR 143 includes 30 pairs of low refractive index layers and high refractive index layers.

Between respective refractive index layers of the n-DBR 143, there is provided a composition gradient layer having a thickness of 20 nm, for example, whose composition is gradually changed from one composition to the other composition, so as to reduce the electric resistance. The film thickness of each of the above-described refractive index layers is designed to have an optical thickness of $\lambda/4$, including ½ of the adjacent composition gradient layers, in a case where the oscillation wavelength is $\lambda$. Note that, in the case where the optical thickness is $\lambda/4$, the actual thickness D of the layer is: $D=\lambda/4n$ (n is the refractive index of the medium of the layer).

The spacer layer 144 is formed on the n-DBR 143. The spacer layer 144 is, for example, a non-doped AlGaInP layer.

The active layer 145 is formed on the spacer layer 144. The active layer 145 is, for example, an active layer having a triple quantum well structure, which includes three quantum well layers and four barrier layers. Each of the quantum well layers is an InGaAs layer, and each of the barrier layers is an AlGaAs layer.

The spacer layer 146 is formed on the active layer 145. The spacer layer 146 is, for example, a non-doped AlGaInP layer.

The portion including the spacer layer 144, the active layer 145, and the spacer layer 146 is also referred to as a resonator structure (resonator region) and is designed to have an optical thickness of one wavelength ($\lambda$), including ½ of the adjacent composition gradient layers. Note that the active layer 145 is located in the center of the resonator structure, which is the position corresponding to the antinode in the standing wave distribution of the electric field, so that a high stimulated emission probability can be obtained.

The p-DBR 147 is formed on the spacer layer 146. The p-DBR 147 is, for example, a semiconductor multilayer film reflector, which is configured with a laminated multiple p-type semiconductor films. The p-DBR 147 includes, for example, a low refractive index layer made of p-$Al_{0.9}Ga_{0.1}As$ and a high refractive index layer made of p-$Al_{0.2}Ga_{0.8}As$. For example, the p-DBR 147 includes 20 pairs of low refractive index layers and high refractive index layers.

Between respective refractive index layers of the p-DBR 147, there is provided a composition gradient layer having a thickness of 20 nm, for example, whose composition is gradually changed from one composition to the other composition, so as to reduce the electric resistance. The film thickness of each of the above-described refractive index layers is designed to have an optical thickness of $\lambda/4$, including ½ of the adjacent composition gradient layers, in a case where the oscillation wavelength is $\lambda$.

In the p-DBR 147, for example, the selective oxidation layer 151 made of p-AlAs, or the like, having a thickness of 30 nm is inserted. The insertion position of the selective oxidation layer 151 may be, for example, within the second pair of the high refractive index layer and the low refractive index layer, counting from the spacer layer 146. Note that the selective oxidation layer 151 may include layers such as an intermediate layer and a composition gradient layer in the above and below. Here, the selective oxidation layer 151 including a layer that is actually oxidized is referred to as a selective oxidation layer.

A mesa 150 corresponding to a VCSEL element 159 is formed by etching to remove the p-DBR 147, the spacer layer 146, the active layer 145, the spacer layer 144, and a part of the n-DBR 143.

The insulating layer 153 is formed to cover mesas 150. As a material of the insulating layer 153, for example, SiN, SiON, $SiO_2$, or the like, can be used. In the insulating layer 153, an opening 154 is formed to expose a part of the p-DBR 147 at the top part of each mesa 150, and an opening 156 is formed to expose a part of the n-DBR 143 at the bottom part of a groove between mesas 150.

On the insulating layer 153, a p-side electrode 155 that is electrically connected to the p-DBR 147 through the opening 154 is independently formed for each mesa 150. As the p-side electrode 155, for example, a laminated film in which Ti, Pt, and Au are laminated in that order from the p-DBR 147 side can be used.

On the insulating layer 153, an n-side electrode 157 that is electrically connected to the n-DBR 143 through the opening 156 is formed. As the n-side electrode 157, for example, a laminated film in which gold-germanium alloy (AuGe), nickel (Ni), and gold (Au) are laminated in that order from the n-DBR 143 side can be used.

Note that an n-contact layer such as an n-GaAs layer may be provided between the n-side electrode 157 and the n-DBR 143, and a p-contact layer such as a p-GaAs layer may be provided between the p-side electrode 155 and the p-DBR 147.

Structure of the MLA 160

Next, description is given of the MLA 160. In the first embodiment, the MLA 160 includes the plate-shaped base 161 and multiple micro-lenses 162 arranged in an array at positions of the base 161 corresponding to respective VCSEL elements 159. Each micro-lens 162 is arranged such that the optical axis thereof passes through the emitting region 148 of the VCSEL element 159. The material of the MLA 160 allows laser light emitted by the VCSEL elements 159 to penetrate through the MLA 160, and the refractive index of the material is lower than the refractive index of the substrate 141. The material of the MLA 160 is, for example, a resin material such as an epoxy resin or an acrylic resin, or an inorganic material such as $SiO_2$. A glass may be used as the inorganic material. The refractive index of the MLA 160 is approximately 1.5, for example. Each of the micro-lenses 162 is formed so that a desired beam can be formed for the emission pattern of a VCSEL element 159. For example, the lens diameter is approximately 50 μm and the curvature radius is approximately 70 μm. Furthermore, for example, the height (lens thickness) from the surface 140b to the top of a micro-lens 162 is approximately 100 μm, and the height (sag amount) from the top surface of the base 161 to the top of a micro-lens 162 is approximately 15 μm. A micro-lens 162 is an example of an optical element.

Figure 3A:
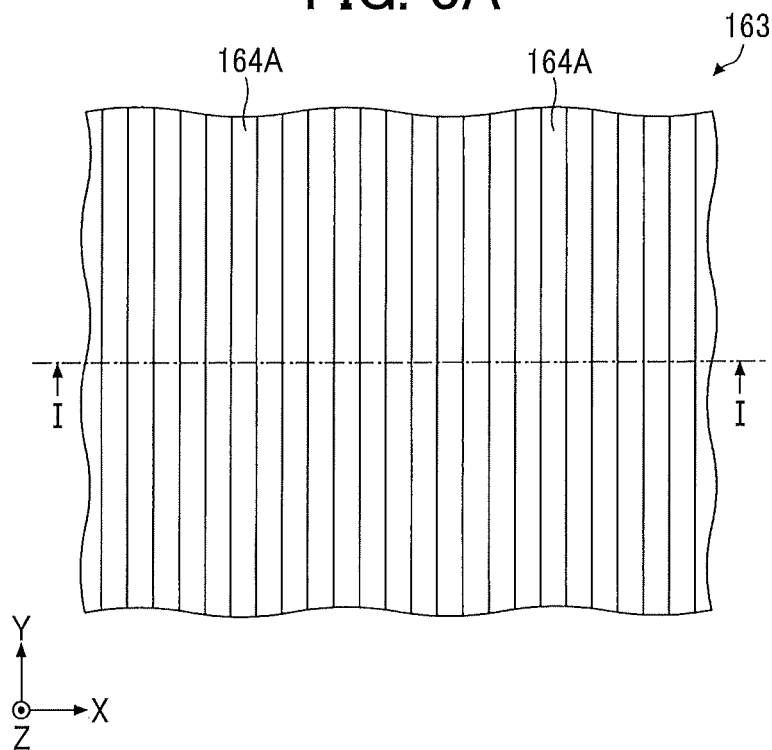
FIG. 3A is a plan view illustrating an example of an anti-reflection structure.
Figure 3B:
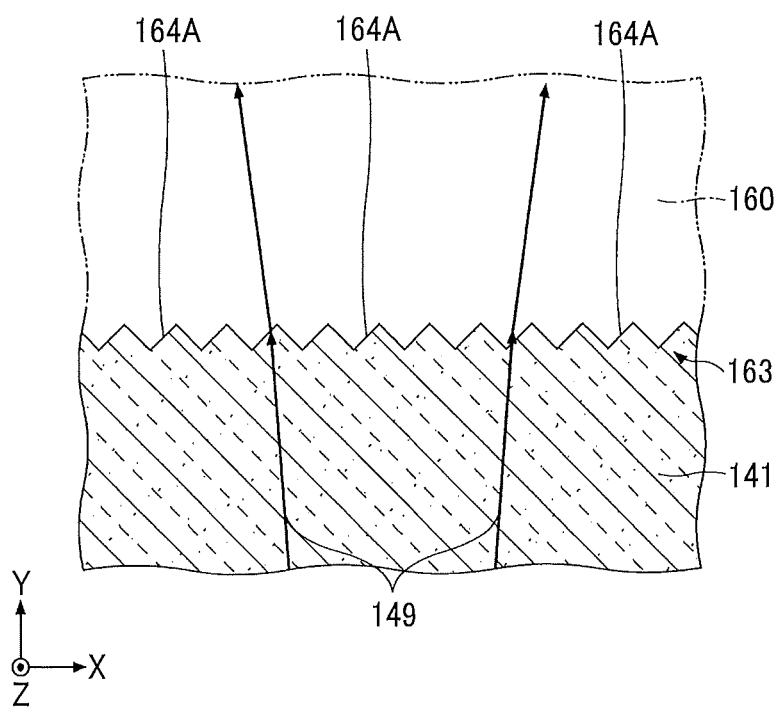
FIG. 3B is a cross-sectional view illustrating an example of the anti-reflection structure as illustrated in FIG. 3A.

The optical device 100 includes an anti-reflection structure between the VCSEL chip 140 and the MLA 160. The anti-reflection structure is, for example, a sub-wavelength structure whose cycle is smaller than the oscillation wavelength (for example, 940 nm) of the VCSEL elements 159. FIG. 3A is a plan view illustrating an example of the anti-reflection structure, and FIG. 3B is a cross-sectional view illustrating an example of the anti-reflection structure as illustrated in FIG. 3A. FIG. 3B is a cross-sectional view taken along the line II-II in FIG. 3A.

For example, as the anti-reflection structure 163, a groove 164A having a triangular cross section with a height of approximately 100 nm is formed on the surface (second surface) 141b of the substrate 141 facing the MLA 160 (surface 140b of the VCSEL chip 140) with a constant pitch of approximately 200 nm, as illustrated in FIG. 3A and FIG. 3B. Each groove 164A extends in the Y direction and is arranged one-dimensionally in the X direction. The pitch of the grooves 164A may be irregular.

Structure of the Optical Device 100

On the surface 120a of the mounting substrate 120 facing the surface 140a, an electrode to which an n-side electrode 157 is joined and an electrode to which a p-side electrode 155 is joined are formed. Furthermore, the VCSEL chip 140 is mounted on the mounting substrate 120 in flip-chip mounting. The mounting substrate 120 may include, for example, an $Al_2O_3$ substrate or an AlN substrate.

In each VCSEL element 159 of the optical device 100 configured as described above, laser light 149 is generated in the emitting region 148 of the resonator structure (resonator region), which overlaps the non-oxidized region 151b on an approximately planar view, and the laser light 149 is incident from the VCSEL element 159 to the micro-lens 162. Since the anti-reflection structure 163 is formed on the surface 141b, the laser light 149 is hardly reflected at the interface between the substrate 141 and the micro-lens 162 and can be incident to the micro-lens 162. The micro-lens 162 reduces the emission angle of the laser light 149 and allows the laser light 149 to outgo as approximately parallel light.

Furthermore, since the anti-reflection structure 163 including a groove 164A is formed, excellent adhesiveness is realized between the surface 140b and a micro-lens 162, compared to a case in which the surface 140b is flat.

As described above, the oscillation wavelength of a VCSEL element 159 is in the 940 nm band (approximately 940 nm±30 nm). This wavelength band is one of the wavelength bands that are absorbed by the atmosphere of the earth. Therefore, in a case where a VCSEL element 159 is applied to a distance-measuring apparatus that uses laser light, etc., a system with a low noise can be configured. Furthermore, the 940 nm band is also a wavelength band in which the absorption coefficient of a Yb:YAG solid-state laser is large, and, therefore, highly efficient pumping of a Yb:YAG solid-state laser is possible. Moreover, InGaAs used for a quantum well layer of the active layer 145 has a compressive strain with respect to GaAs, and a VCSEL element 159 has a high differential gain. Therefore, the VCSEL chip 140 is able to oscillate with a low threshold value, and the light conversion efficiency of the VCSEL chip 140 is excellent. Furthermore, since InGaAs does not include chemically active Al, the small amount of oxygen that is present in a reaction chamber during crystal growth is not easily taken in the active layer 145. Therefore, high reliability can be obtained as well.

Method for Manufacturing the Optical Device 100

Next, description is given of a method for manufacturing the optical device 100. FIGS. 4A through 4I are cross-sectional views illustrating a method for manufacturing the optical device 100. In FIGS. 4A through 4I, a change of the cross section taken along the line I-I in FIG. 2 is illustrated.

First, as illustrated in FIG. 4A, on the surface (first surface) 141a of the substrate 141, which is the opposite side of the surface 141b, an n-DBR 143, a spacer layer 144, an active layer 145, and a spacer layer 146, and a p-DBR 147 are grown in that order. The p-DBR 147 includes, for example, a selective oxidation layer 151 made of p-AlAs. The semiconductor laminated structure of the n-DBR 143, the spacer layer 144, the active layer 145, the spacer layer 146, and the p-DBR 147 can be fabricated by, for example, crystal growth in a metal organic chemical vapor deposition (MOCVD) method or a molecular beam epitaxy (MBE) method. Here, the example by use of a MOCVD method is explained. As an example, trimethylaluminium (TMA), trimethylgallium (TMG), trimethylindium (TMI), etc., are used as the materials of group III, and phosphine ($PH_3$) and arsine ($AsH_3$) are used as the materials of group V. As an example, carbon tetrabromide ($CBr_4$) is used as the material of p-type dopant, and hydrogen selenide ($H_2Se$) is used as the material of n-type dopant. For the substrate 141, an n-GaAs substrate having a mirror-polished surface can be used, for example.

Next, by use of a photolithography technology, a resist pattern corresponding to a desired planar shape of mesas 150 is formed on the p-DBR 147. Then, for example, in an electron cyclotron resonance (ECR) etching method by use of $Cl_2$ gas, etching is performed on partial layers of the semiconductor laminated structure in the region that is not covered by the resist pattern, so that the mesas 150 are formed as illustrated in FIG. 4B. Here, the mesas 150 are formed in such a manner that the selective oxidation layer 151 is exposed at least. After etching, the resist pattern is removed. For example, etching can be stopped in the middle of the n-DBR 143.

Next, as illustrated in FIG. 4C, a heating process (oxidation process) in steam is performed on the semiconductor laminated structure, in which the mesas 150 are formed, as the target object to be oxidized. As a result, Al (aluminum) in the selective oxidation layer 151 is selectively oxidized from the periphery of each mesa 150. Then, a non-oxidized region 151b that is not oxidized and is surrounded by the oxidized region 151a of Al is left in the central part of each mesa 150. Accordingly, an oxide-confined structure, in which the path of driving current for an emitting part is limited to the central part of the mesa 150 only, is formed. The non-oxidized region 151b is the current passing region (current injection region).

Figure 4D:
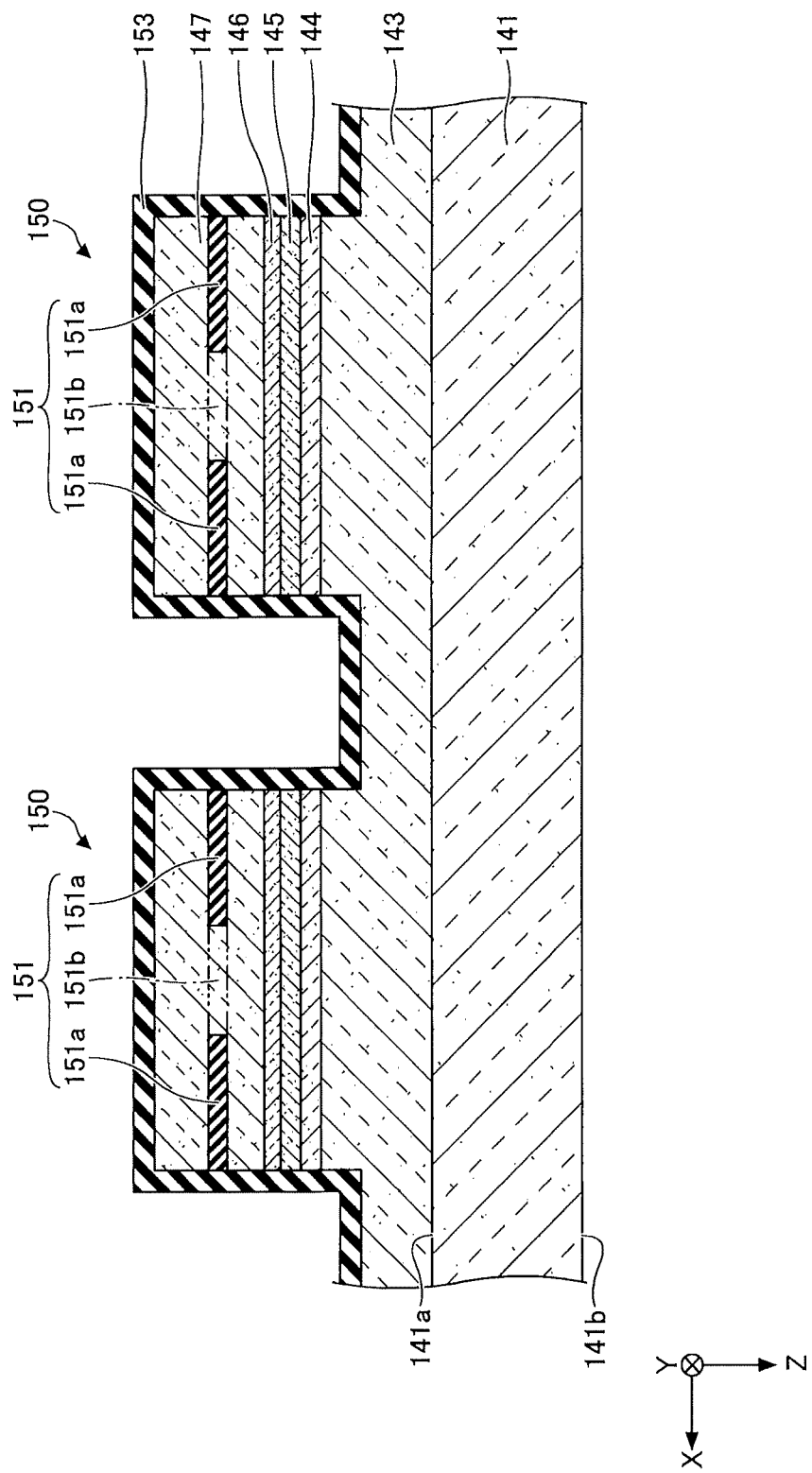
FIG. 4D is a cross-sectional view illustrating a method for manufacturing the optical device according to the first embodiment.

Next, as illustrated in FIG. 4D, the optically transparent insulating layer 153 that continuously covers the top surfaces and side surfaces of the mesas 150 and the bottom surfaces of the grooves between the mesas 150 is formed by use of a plasma CVD method, for example. The material of the insulating layer 153 can be, for example, SiN, SiON, $SiO_2$, or the like.

Next, as illustrated in FIG. 4E, the insulating layer 153 formed on a part of the top surface of each mesa 150 (the part other than the periphery of the top surface of the p-DBR 147) is removed by use of a photolithography technology, so as to open a window and form an opening 154 (contact region). Then, by forming a resist pattern by use of a photolithography technology, forming a metal film, and performing a lift-off process, a p-side electrode 155 is formed. In the formation of the metal film, for example, by use of a vapor deposition method, Ti, Pt, and Au are laminated in that order on the insulating layer 153 and on the p-DBR 147 that is exposed from the opening 154. A contact layer may be formed between the p-DBR 147 and the p-side electrode 155.

Next, as illustrated in FIG. 4F, the insulating layer 153 formed on a part of the bottom surface of the groove between the mesas 150 is removed by use of a photolithography technology, so as to open a window and form an opening 156 (contact region). Then, by forming a resist pattern by use of a photolithography technology, forming a metal film, and performing a lift-off process, an n-side electrode 157 is formed. In the formation of the metal film, for example, by use of a vapor deposition method, AuGe, Ni, and Au are laminated in that order on the n-DBR 143 that is exposed from the opening 156. A contact layer may be formed between the n-DBR 143 and the n-side electrode 157.

Next, the surface 141b of the substrate 141 is polished. For example, from the viewpoint of ease of handling, the thickness of the substrate 141 is preferred to be approximately 500 μm until the p-side electrode 155 and the n-side electrode 157 are formed. On the other hand, regarding a product of the optical device 100, the thickness of the substrate 141 is preferred to be approximately 200 μm from the viewpoint of light loss, etc. Therefore, after forming the n-side electrode 157, the surface 141b of the substrate 141 is polished.

Next, the anti-reflection structure 163 (see FIG. 3A and FIG. 3B) is formed on the surface 141b of the substrate 141. In the formation of the anti-reflection structure 163, for example, a fine groove 164A having a triangular cross section is formed on the surface 141b by use of an electron beam lithography technology.

The VCSEL chip 140 can be formed as described above.

Figure 4G:
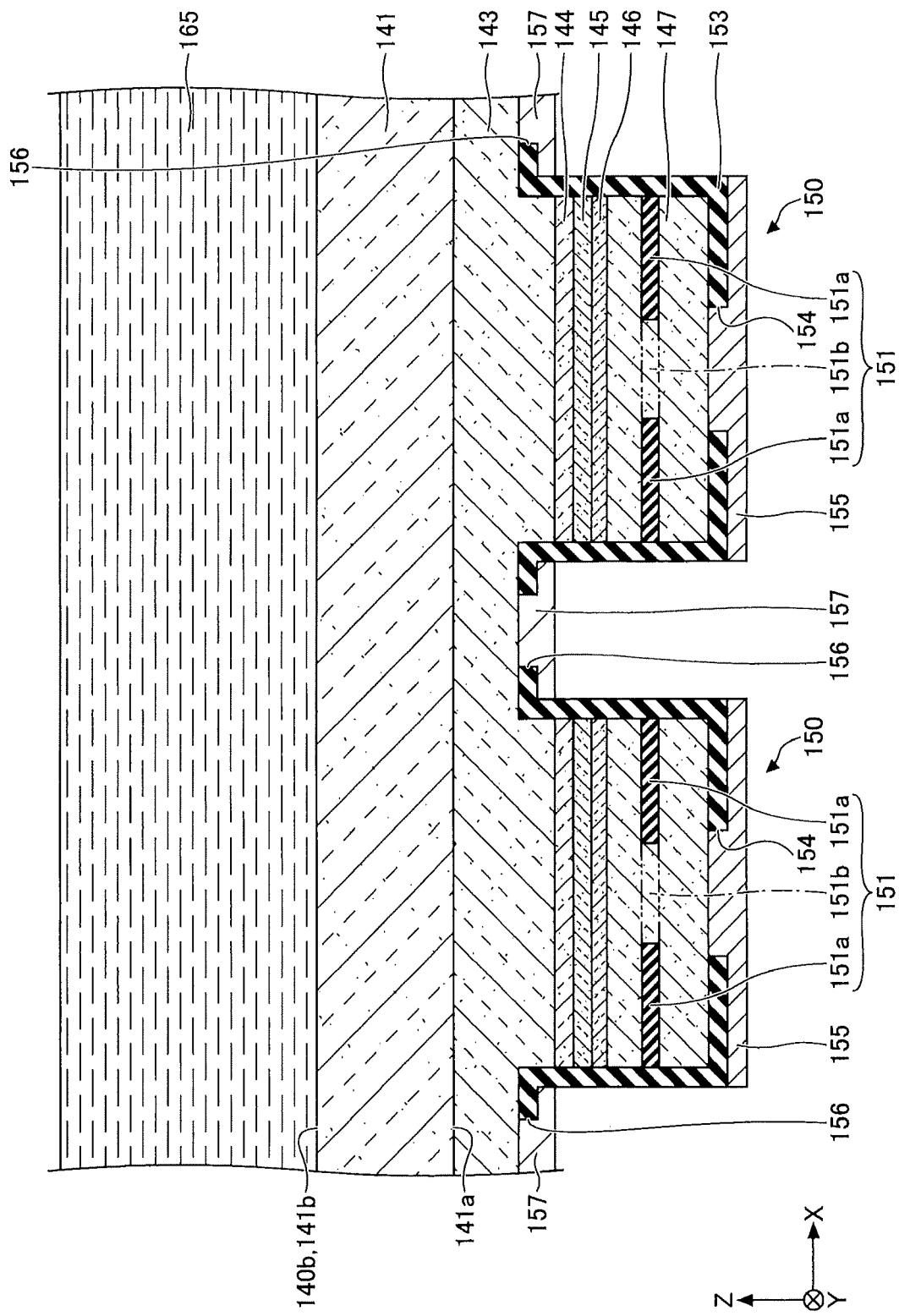
FIG. 4G is a cross-sectional view illustrating a method for manufacturing the optical device according to the first embodiment.

Next, as illustrated in FIG. 4G, an energy-curable resin 165 that is liquid at room temperature is applied to the surface 140b. As the energy-curable resin 165, a thermosetting resin, an ultraviolet curable resin, an electron beam curable resin, or the like, can be used. Specifically, an epoxy resin, an acrylic resin, etc., can be used.

Figure 4H:
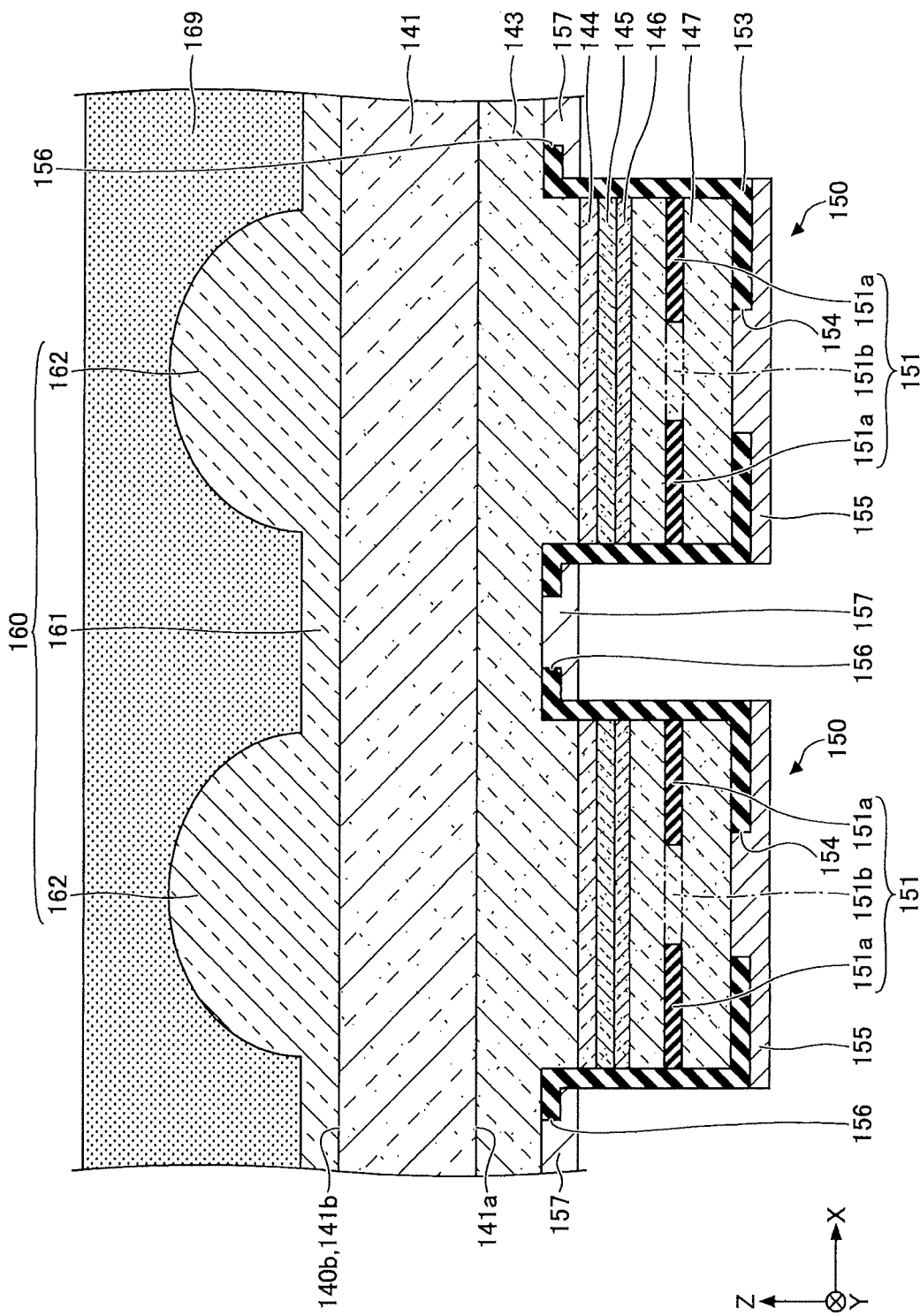
FIG. 4H is a cross-sectional view illustrating a method for manufacturing the optical device according to the first embodiment.

Next, as illustrated in FIG. 4H, the mold 169 having the inverted shape of the MLA 160 is pressed against the energy-curable resin 165. Then, heat, ultraviolet rays, an electron beam, or the like, is applied to the energy-curable resin 165, so as to cause cross-link curing of the energy-curable resin 165 and, accordingly, form the MLA 160 including the base 161 and the micro-lenses 162.

Figure 4I:
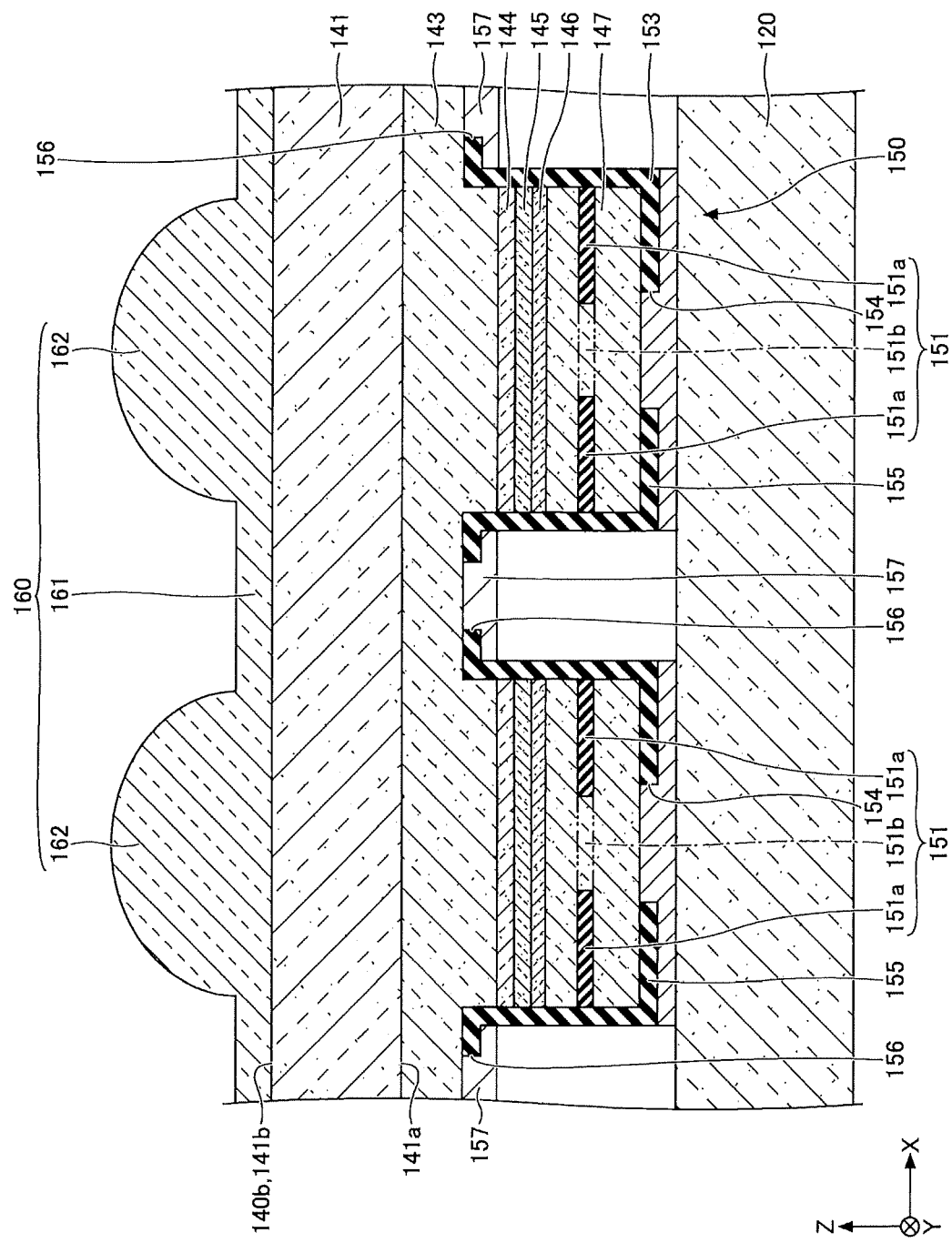
FIG. 4I is a cross-sectional view illustrating a method for manufacturing the optical device according to the first embodiment.

Next, as illustrated in FIG. 4I, the mold 169 is removed. Then, the VCSEL chip 140 having the MLA 160 formed on the surface 140b is mounted on the mounting substrate 120.

The optical device 100 can be manufactured as described above.

In this manufacturing method, the shape of a micro-lens 162 is determined by use of the mold 169. As described above, for example, the lens diameter of a micro-lens 162 is 50 μm and the curvature radius is 70 μm. The mold 169 for forming a micro-lens 162 in such a size can be easily prepared. Therefore, according to the above method, a micro-lens 162 can be easily manufactured with high dimensional precision of the lens diameter, etc.

Note that, if etching is performed on the substrate 141 itself so that a micro-lens is formed on the surface 141b of the substrate 141, the surface 141b is to be processed into a spherical surface with a thickness of approximately 600 nm. It is extremely difficult to perform etching for forming a spherical surface with high precision in such a thin range.

In a case where $SiO_2$ is used as the material of the MLA 160, for example, silanol may be applied, instead of application of an energy-curable resin 165, and then solidified by a condensation reaction by use of the mold 169. Furthermore, an $SiO_2$ film may be formed, instead of application of an energy-curable resin 165, and then processed by photolithography.

Figure 5A:
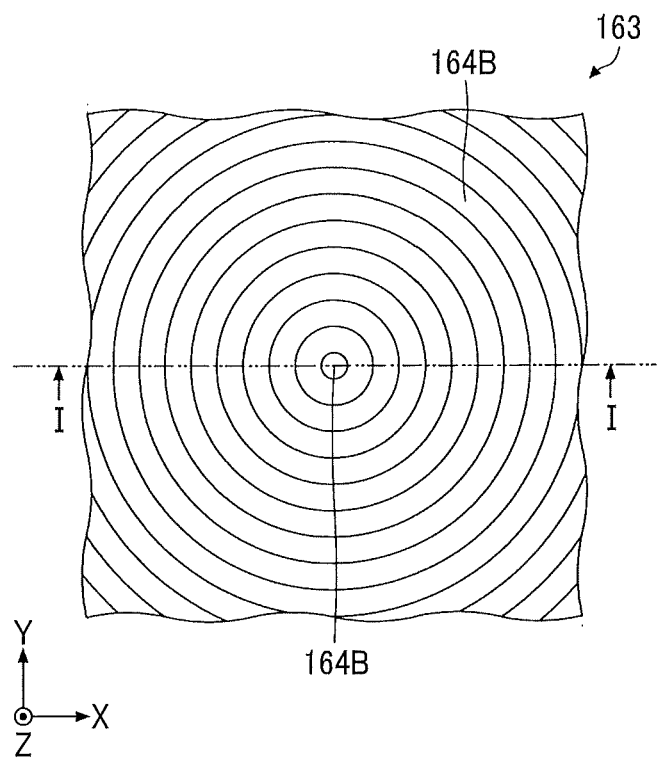
FIG. 5A is a plan view illustrating another example of the anti-reflection structure.
Figure 5B:
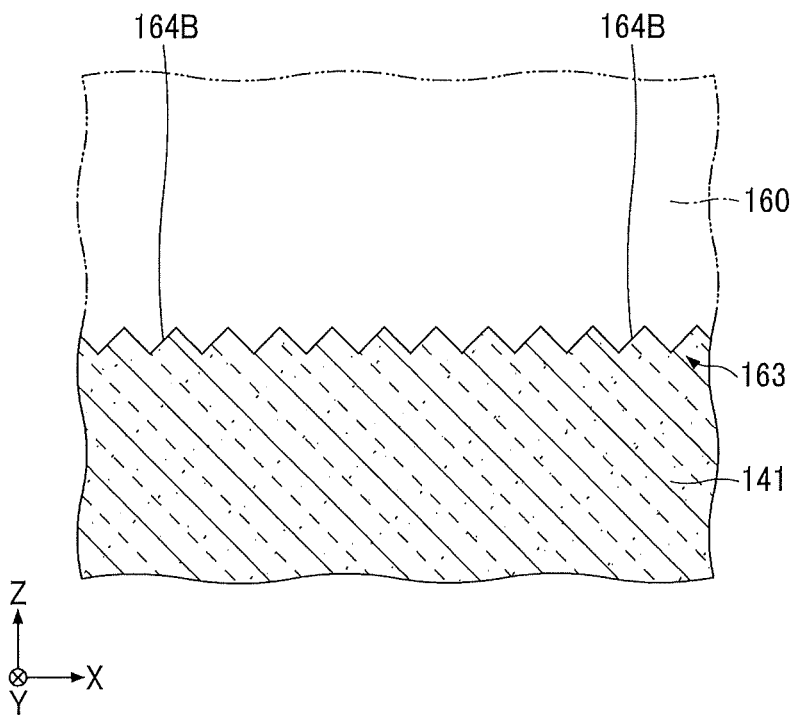
FIG. 5B is a cross-sectional view illustrating the said another example of the anti-reflection structure as illustrated in FIG. 5A.

The form of the anti-reflection structure 163 is not particularly limited as long as the average refractive index gradually changes from the incident side to the outgoing side of laser light 149. FIG. 5A is a plan view illustrating another example of the anti-reflection structure, and FIG. 5B is a cross-sectional view illustrating the said another example of the anti-reflection structure as illustrated in FIG. 5A. Further, FIG. 6A is a plan view illustrating another example of the anti-reflection structure, and FIG. 6B and FIG. 6C are cross-sectional views illustrating the said another example of the anti-reflection structure as illustrated in FIG. 6A.

For example, as illustrated in FIG. 5A and FIG. 5B, a groove 164B having a triangular cross section with a height of approximately 100 nm may be formed with a constant pitch of approximately 200 nm as the anti-reflection structure 163. The grooves 164B are concentrically formed. The center of the circle may be aligned with the optical axis of an emitting region 148 and a micro-lens 162 or may be shifted from the optical axis of an emitting region 148 and a micro-lens 162.

Figure 6A:
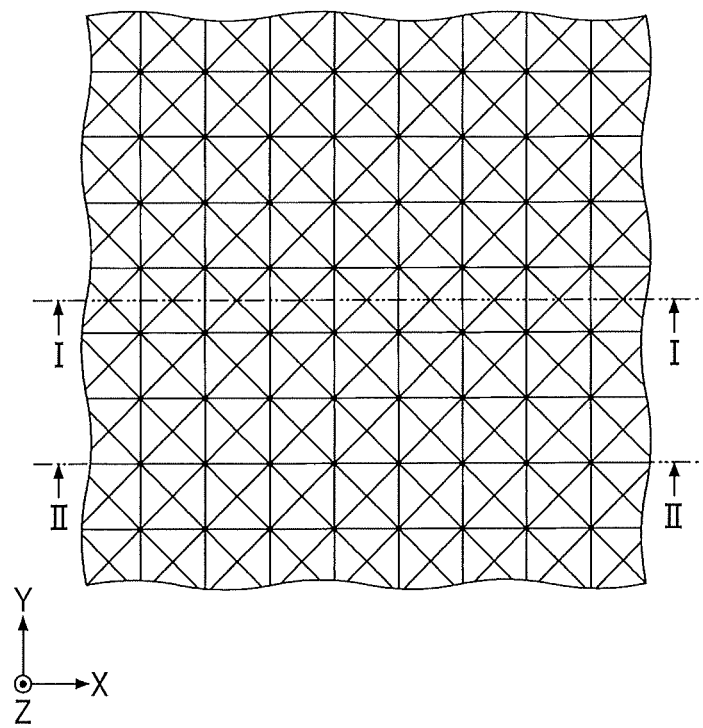
FIG. 6A is a plan view illustrating another example of the anti-reflection structure.
Figure 6B:
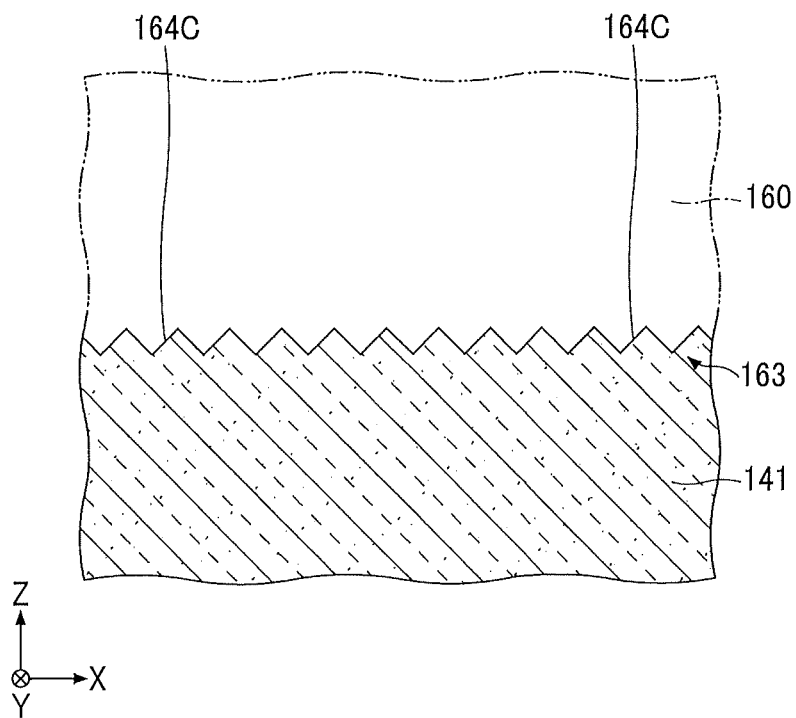
FIG. 6B is a cross-sectional view illustrating the said another example of the anti-reflection structure as illustrated in FIG. 6A.
Figure 6C:
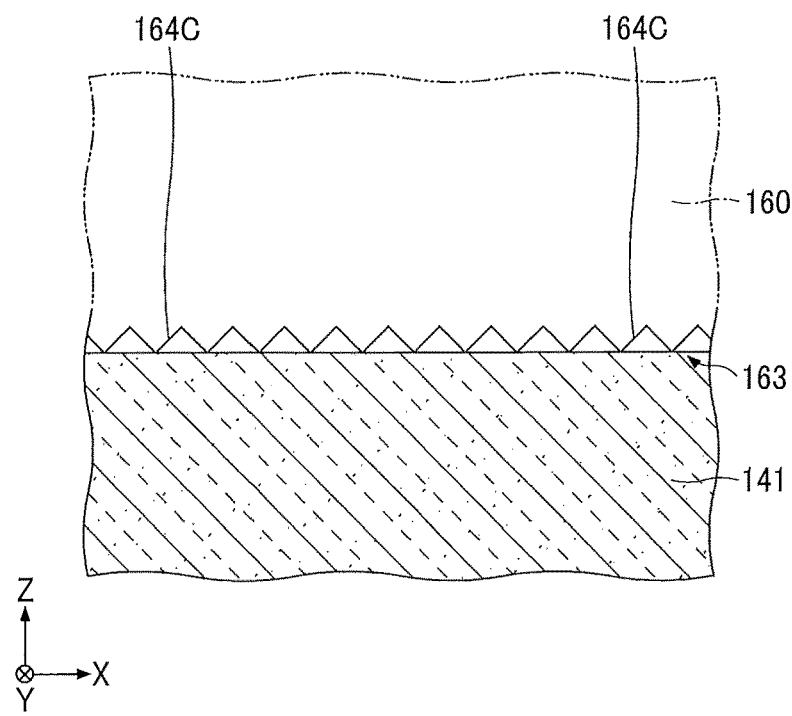
FIG. 6C is a cross-sectional view illustrating the said another example of the anti-reflection structure as illustrated in FIG. 6A.

For example, as illustrated in FIG. 6A, FIG. 6B, and FIG. 6C, square pyramids 164C with a height of approximately 100 nm may be two-dimensionally arranged in the X direction and the Y direction as the anti-reflection structure 163. The size of a square pyramid 164C may be constant or irregular.

The anti-reflection structure 163 may be configured with an anti-reflection film or may include an anti-reflection film. For example, the anti-reflection film is a laminated film in which $HfO_2$ and $SiO_2$ are laminated in that order from the substrate 141 side, and the anti-reflection film is designed to have a transmittance of 99% or more for light in a predetermined wavelength region including 940 nm, which is the oscillation wavelength of the VCSEL elements 159. The anti-reflection film can be formed in a vacuum vapor deposition method, a sputtering method, etc.

Figure 7:
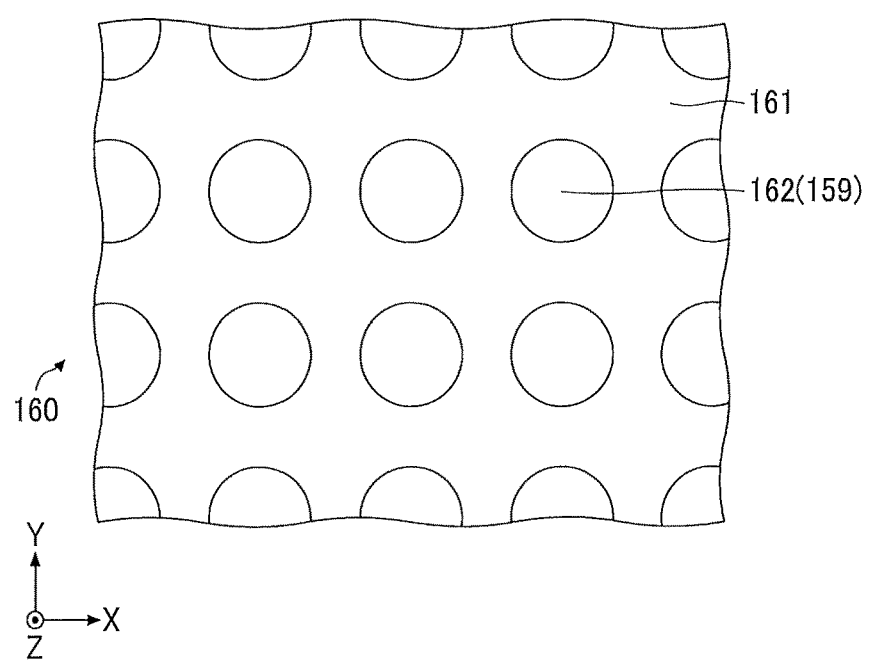
FIG. 7 is a diagram illustrating an example of an arrangement of VCSEL elements and micro-lenses.

The arrangement of the VCSEL elements 159 and the micro-lenses 162 is not limited. That is, a staggered arrangement (triangular lattice arrangement) illustrated in FIG. 1 or a square arrangement (square lattice arrangement) illustrated in FIG. 7 may be possible.

Second Embodiment

Figure 8:
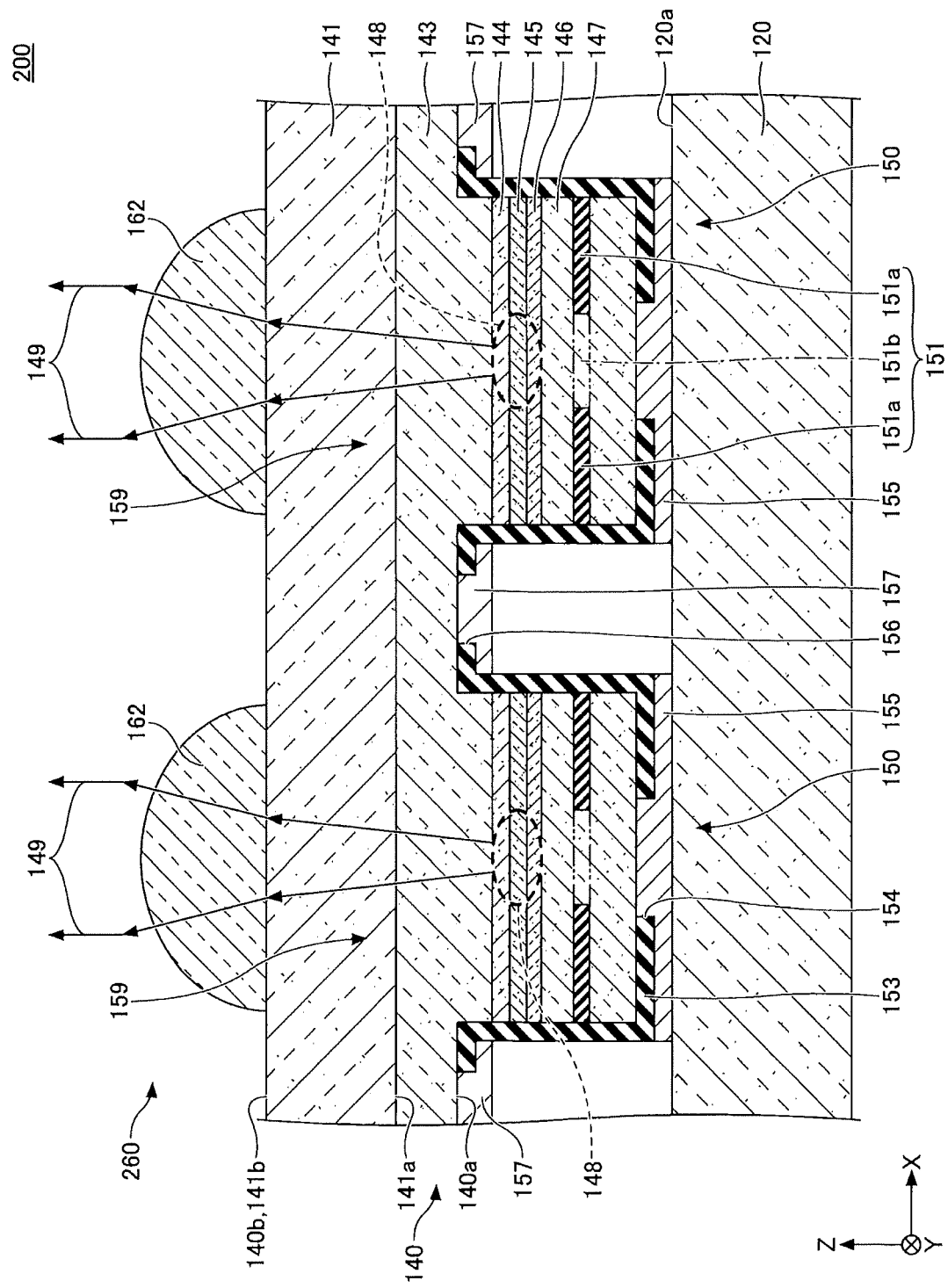
FIG. 8 is a cross-sectional view illustrating an optical device according to the second embodiment.

Next, description is given of the second embodiment. The second embodiment is different from the first embodiment in terms of the configuration of the MLA. FIG. 8 is a cross-sectional view illustrating an optical device according to the second embodiment. FIG. 8 is a cross-sectional view taken along the line I-I in FIG. 1.

As illustrated in FIG. 8, the optical device 200 according to the second embodiment is provided with the MLA 260 including the micro-lenses 162. Unlike the MLA 160, the MLA 260 is not provided with a base that connects the micro-lenses 162. Each of the micro-lenses 162 is formed so that a desired beam can be formed for the emission pattern of a VCSEL element 159. For example, the lens diameter is approximately 60 μm and the curvature radius is approximately 40 μm. Furthermore, the height (sag amount) from the surface 140b to the top of a micro-lens 162 is approximately 15 μm. The other aspects of the configuration are the same as those of the first embodiment.

The same effect as the optical device 100 can be obtained with the optical device 200 as well.

Furthermore, regarding the optical device 200, excellent heat resistance can be obtained. The linear expansion coefficients of the substrate 141 and the resin used for the MLA 160 differ by approximately 10 times. Therefore, even though no stress is applied between the substrate 141 and the MLA 160 at normal temperature, the greater the temperature of the usage environment differs from the normal temperature, the greater stress is applied between the substrate 141 and the MLA 160. Additionally, the larger the contact area of the substrate 141 and the MLA 160 is, the greater the force acting on the micro-lenses 162 becomes. Regarding the optical device 200, since the MLA 160 does not include a base and the micro-lenses 162 are formed independently from each other, the force acting on each micro-lens 162 is smaller than the force in the optical device 100. Therefore, more stable operation can be realized even in a case where the temperature changes. Particularly, the optical device 200 is preferred to be applied to a sensing system used in a high temperature environment.

Figure 9A:
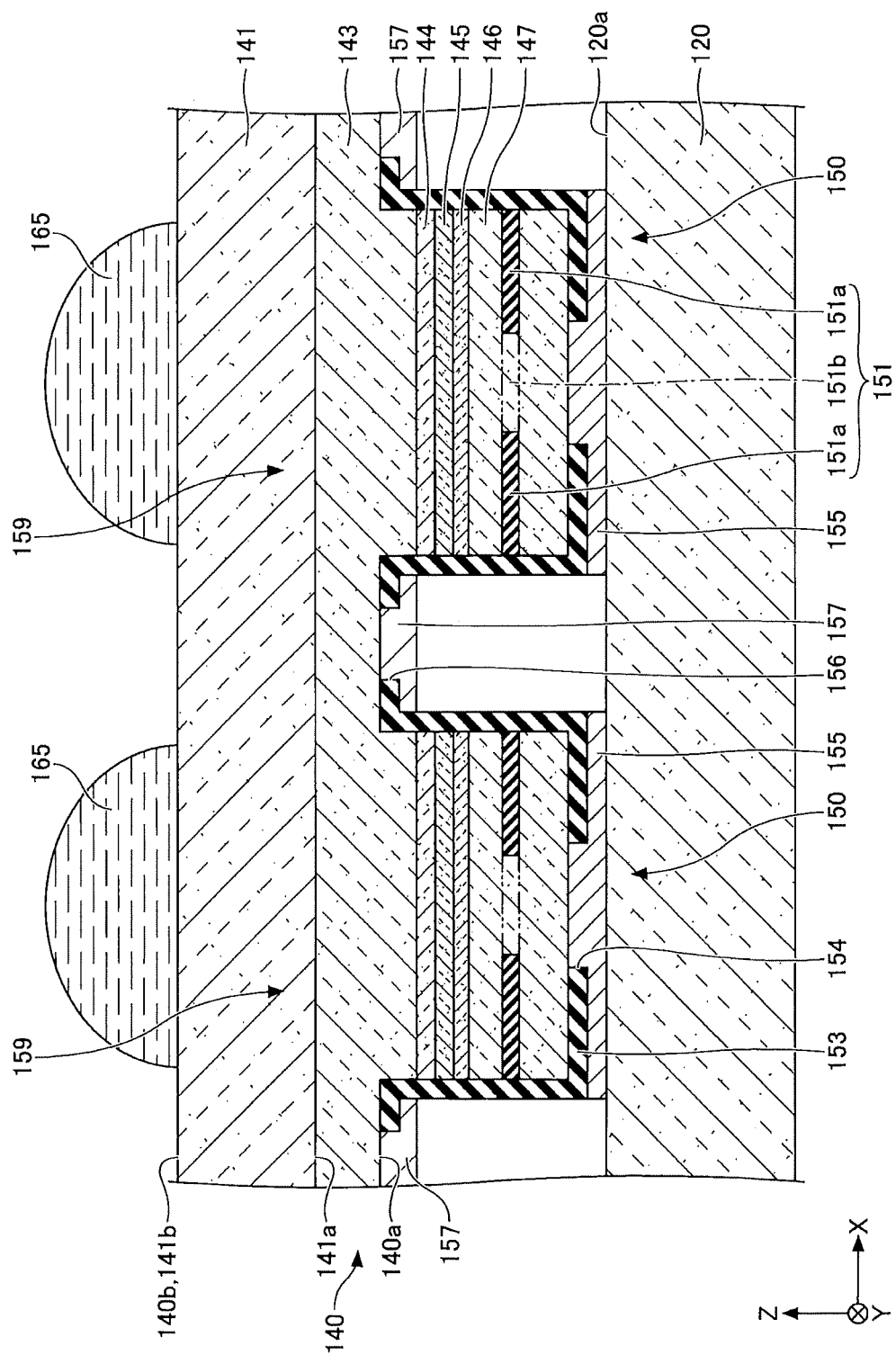
FIG. 9A is a cross-sectional view illustrating a method for manufacturing the optical device according to the second embodiment.
Figure 9B:
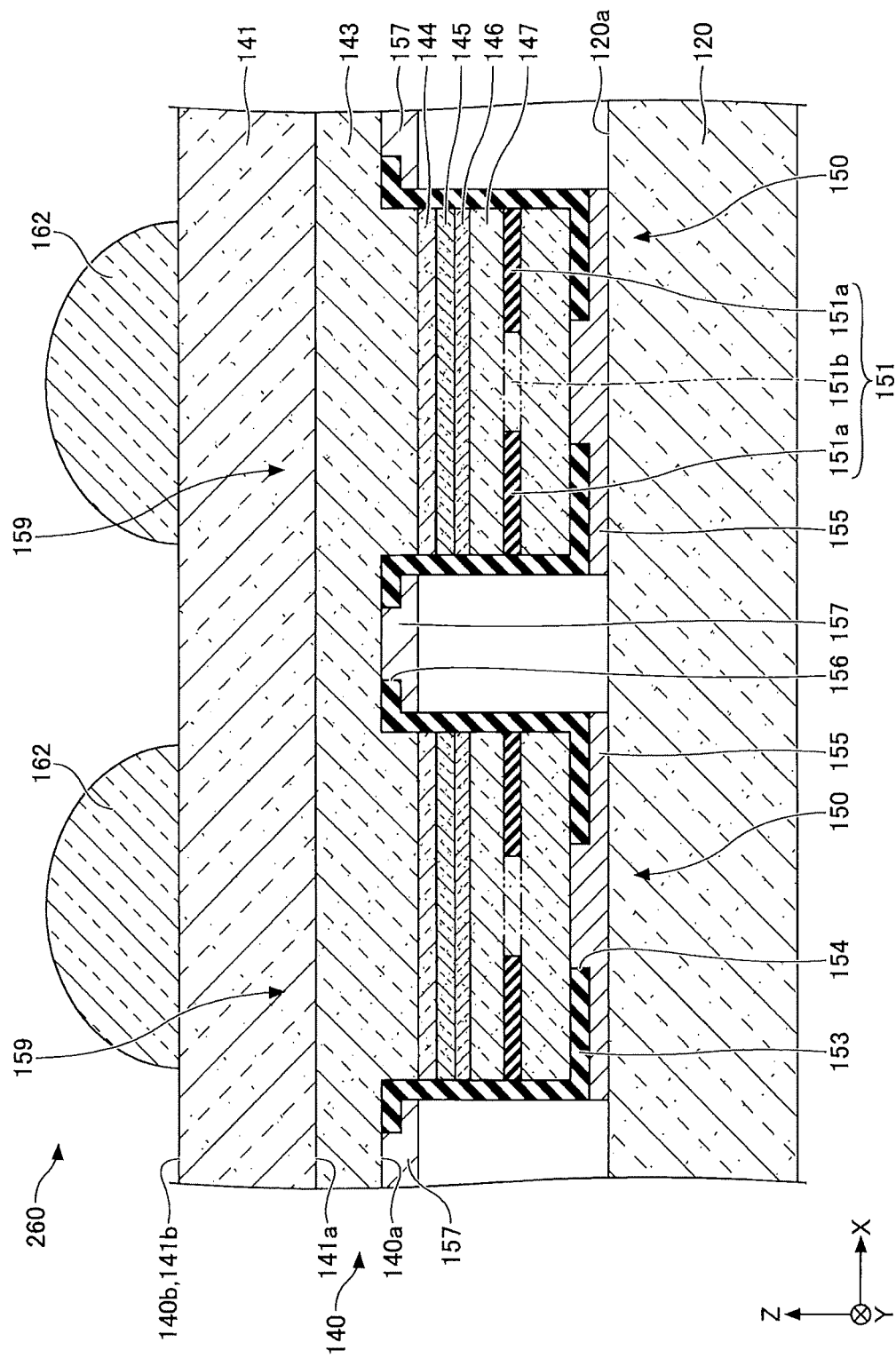
FIG. 9B is a cross-sectional view illustrating a method for manufacturing the optical device according to the second embodiment.

Next, description is given of a method for manufacturing the optical device 200 according to the second embodiment. FIG. 9A and FIG. 9B are cross-sectional views illustrating a method for manufacturing the optical device 200 according to the second embodiment.

In this manufacturing method, first, the VCSEL chip 140 is formed in the same way as in the first embodiment.

Next, as illustrated in FIG. 9A, an energy-curable resin 165 that is liquid at room temperature is individually disposed on a portion of the surface 140b where a micro-lens 162 is to be formed. For example, the energy-curable resin 165 may be formed in a method that directly ejects resin material, such as an ink jet method or a dispensing method. In a case where a small amount of liquid energy-curable resin 165 is ejected, the energy-curable resin 165 has a spherical lens shape due to surface tension.

Next, heat, ultraviolet rays, an electron beam, or the like, is applied to the energy-curable resin 165, so as to cause cross-link curing of the energy-curable resin 165 and, accordingly, form the MLA 260 including the micro-lenses 162 as illustrated in FIG. 9B.

Thereafter, the VCSEL chip 140 having the MLA 260 formed on the surface 140b is mounted on the mounting substrate 120 in the same way as in the first embodiment.

The optical device 200 can be manufactured as described above.

In this manufacturing method, the shape of a micro-lens 162 is determined by use of surface tension of a liquid energy-curable resin 165.

In addition, compared to the first embodiment, it is possible to suppress an occurrence of an optical axis shift (eccentricity error) between each emitting region 148 and micro-lens 162. In the first embodiment, in a case where there is an alignment shift between the mold 169 and the substrate 141, an eccentricity error may occur in every combination of the VCSEL elements 159 and the micro-lenses 162. On the other hand, in the second embodiment, although an eccentricity error occurs between a pair of a VCSEL element 159 and a micro-lens 162, that effect does not easily affect the other pairs. Therefore, according to the second embodiment, higher light-collecting quality can be easily obtained.

Furthermore, in the first embodiment, the pressure from the mold 169 acts on the VCSEL chip 140 as well, but, in the second embodiment, no such pressure is applied. Since the thickness of the VCSEL chip 140 is, for example, approximately 100 µm to 200 µm, there is a possibility that the VCSEL chip 140 is damaged due to the pressure. However, according to the second embodiment, such damage can be prevented.

In addition, by forming a sub-wavelength structure as the anti-reflection structure 163 only at the portion where a micro-lens 162 is to be formed, the wettability of the energy-curable resin 165 on the surface 141b can be adjusted. By increasing the wettability of the portion where a micro-lens 162 is to be formed, compared to the surrounding portion, it is possible to suppress spreading of the ejected energy-curable resin 165 and improve the precision of the lens diameter of the micro-lens 162.

Third Embodiment

Figure 10:
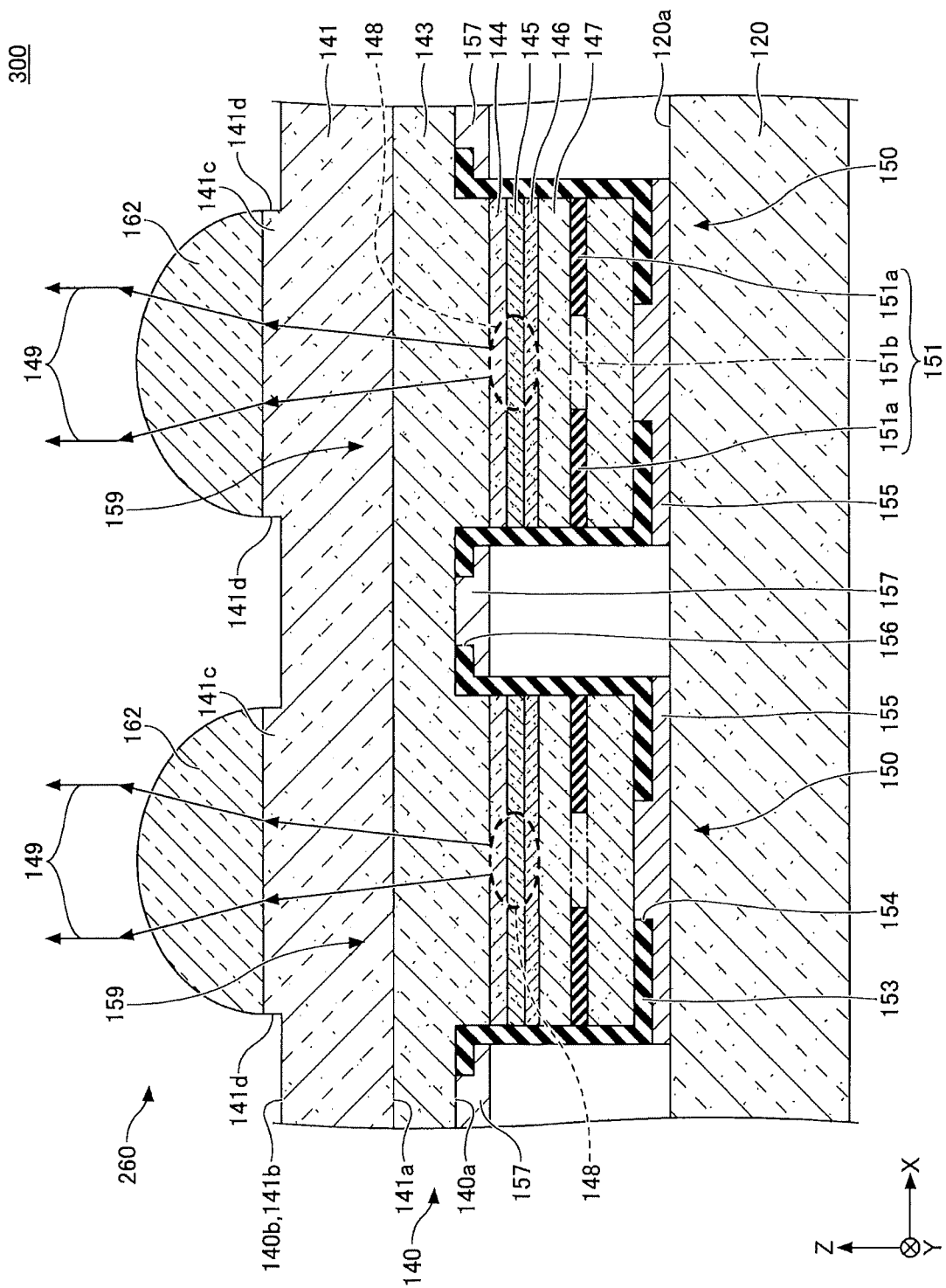
FIG. 10 is a cross-sectional view illustrating an optical device according to the third embodiment.

Next, description is given of the third embodiment. The third embodiment is different from the second embodiment in terms of the configuration of the substrate of the VCSEL chip. FIG. 10 is a cross-sectional view illustrating an optical device according to the third embodiment. FIG. 10 is a cross-sectional view taken along the line 14 in FIG. 1.

As illustrated in FIG. 10, regarding the optical device 300 according to the third embodiment, a convex portion 141c is formed at a portion of the surface 141b where a micro-lens 162 is formed, and a concave portion 141d is formed around the convex portion 141c. That is, a step is formed between a portion overlapping a micro-lens 162 on a planar view and a portion around the overlapping portion. The other aspects of the configuration are the same as those of the second embodiment.

The same effect as the optical device 200 can be obtained with the optical device 300 as well.

Furthermore, according to the optical device 300, the precision of the lens diameter of a micro-lens 162 can be improved. Prior to the formation of the micro-lenses 162, the convex portions 141c and the concave portions 141d are formed on the surface 141b. The micro-lenses 162 can be formed in the same way as in the second embodiment. Since a wet pinning effect is developed between a convex portion 141c and a concave portion 141d, the liquid energy-curable resin 165 provided on a convex portion 141c is less likely to spread to the outside of the convex portion 141c. Therefore, the planar shape of a micro-lens 162 can be controlled with high precision by the planar shape of a convex portion 141c.

In addition, in a case where the amount of the energy-curable resin 165 per micro-lens 162 is increased, compared to that of the second embodiment, the curvature of the energy-curable resin 165 becomes larger. Therefore, it is also possible to obtain a micro-lens 162 with a large curvature, a strong refractive power, and a high light-collecting efficiency.

Fourth Embodiment

Figure 11:
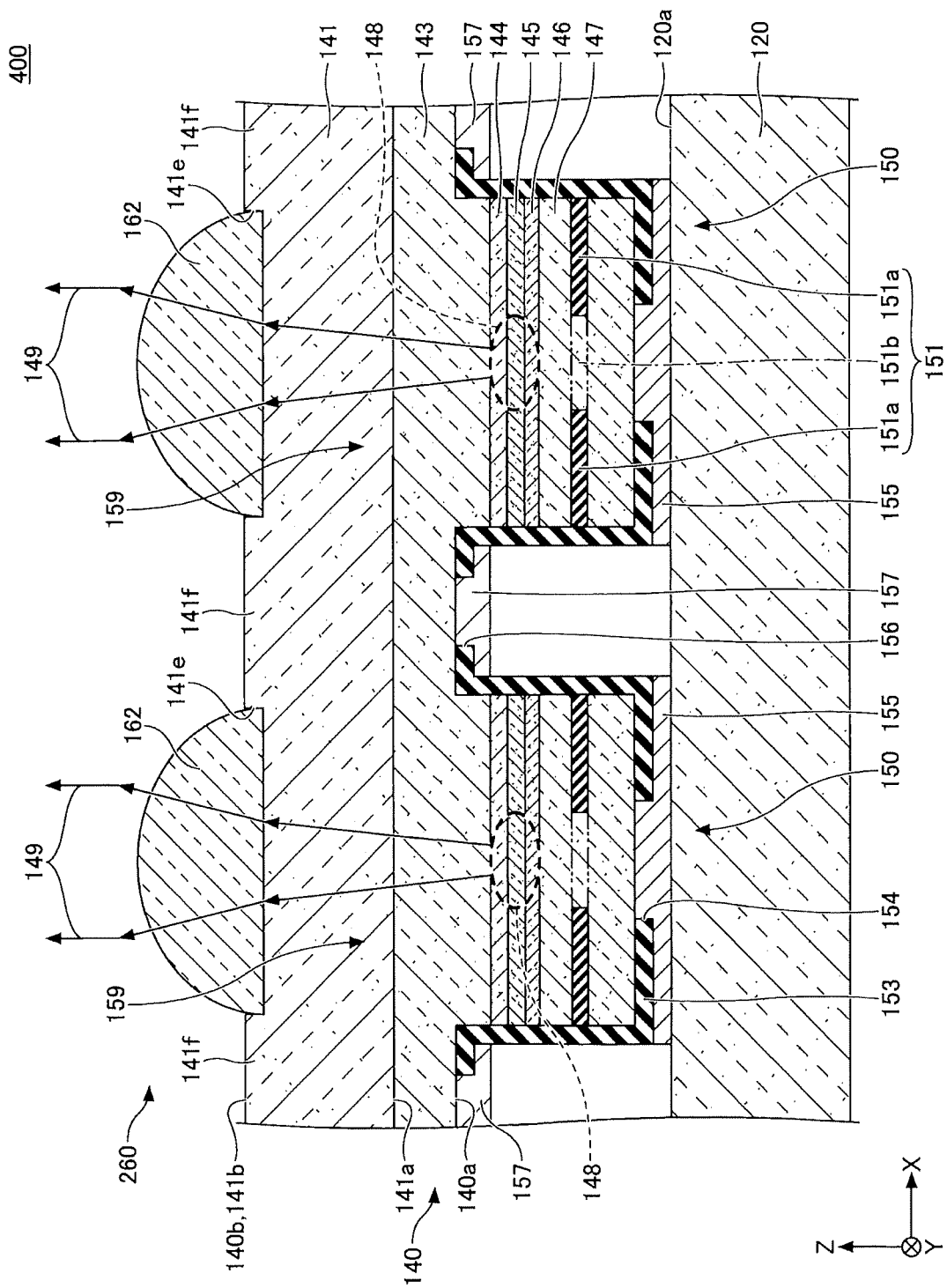
FIG. 11 is a cross-sectional view illustrating an optical device according to the fourth embodiment.

Next, description is given of the fourth embodiment. The fourth embodiment is different from the second embodiment in terms of the configuration of the substrate of the VCSEL chip. FIG. 11 is a cross-sectional view illustrating an optical device according to the fourth embodiment. FIG. 11 is a cross-sectional view taken along the line I-I in FIG. 1.

As illustrated in FIG. 11, regarding the optical device 400 according to the fourth embodiment, a concave portion 141e is formed at a portion of the surface 141b where a micro-lens 162 is formed, and a convex portion 141f is formed around the concave portion 141e. That is, a step is formed between a portion overlapping a micro-lens 162 on a planar view and a portion around the overlapping portion. The other aspects of the configuration are the same as those of the second embodiment.

The same effect as the optical device 200 can be obtained with the optical device 400 as well.

Furthermore, according to the optical device 400, the precision of the lens diameter of a micro-lens 162 can be improved. Prior to the formation of the micro-lenses 162, the concave portions 141e and the convex portions 141f are formed on the surface 141b. The micro-lenses 162 can be formed in the same way as in the second embodiment. Since a wet pinning effect is developed between a concave portion 141e and a convex portion 141f, the liquid energy-curable resin 165 provided in a concave portion 141e is less likely to spread to the outside of the concave portion 141e. Therefore, the planar shape of a micro-lens 162 can be controlled with high precision by the planar shape of a concave portion 141e.

Furthermore, as with the optical device 300, a micro-lens 162 with a high light-collecting efficiency can be obtained with the optical device 400 as well.

Fifth Embodiment

Figure 12:
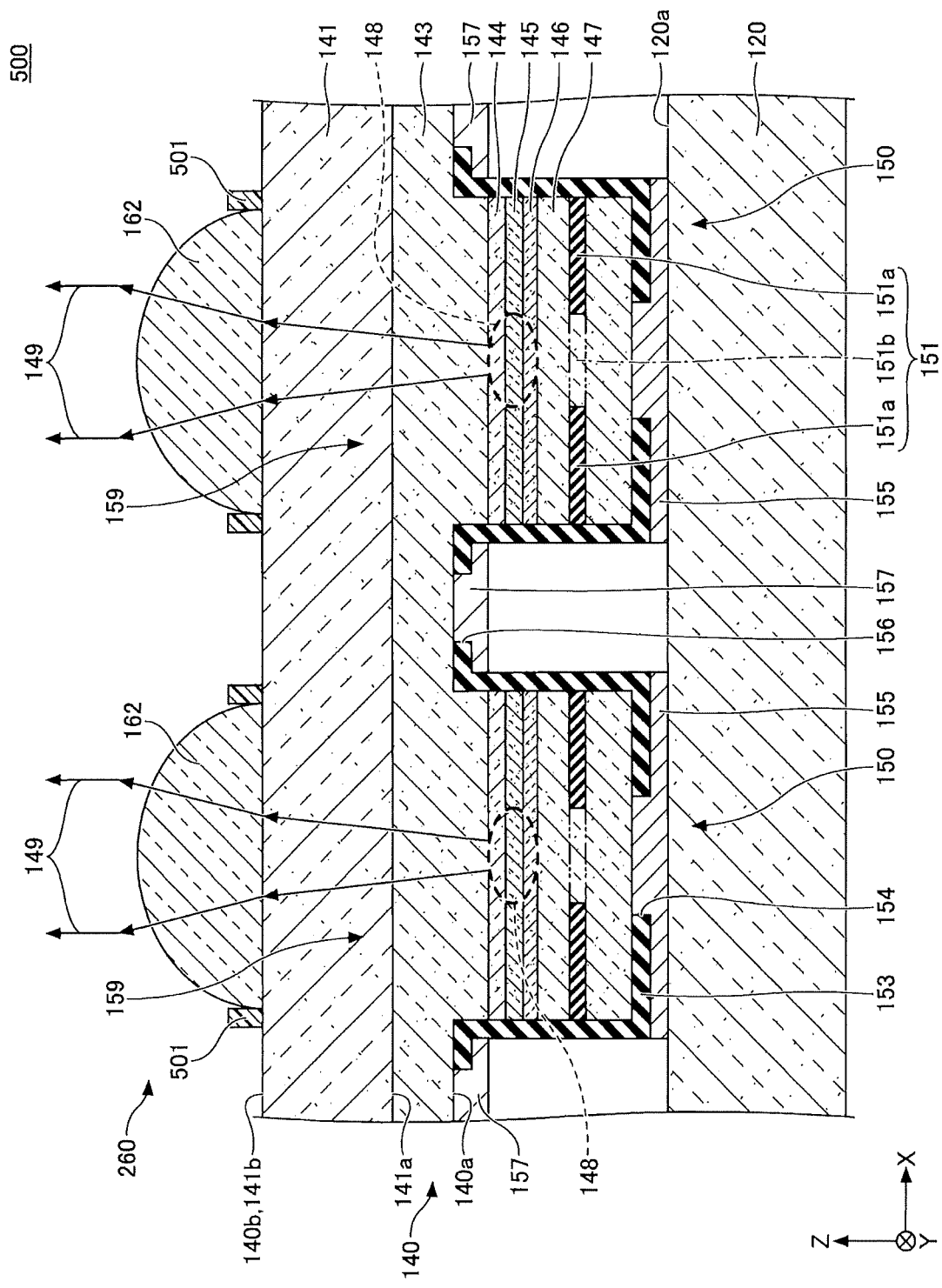
FIG. 12 is a cross-sectional view illustrating an optical device according to the fifth embodiment.

Next, description is given of the fifth embodiment. The fifth embodiment is different from the second embodiment in terms of the configuration of the periphery of a micro-lens. FIG. 12 is a cross-sectional view illustrating an optical device according to the fifth embodiment. FIG. 12 is a cross-sectional view taken along the line I-I in FIG. 1.

As illustrated in FIG. 12, the optical device 500 according to the fifth embodiment includes a frame 501 surrounding a micro-lens 162 on the surface 141b. The material of the frame 501 is, for example, a photoresist. The other aspects of the configuration are the same as those of the second embodiment.

The same effect as the optical device 200 can be obtained with the optical device 500 as well.

Furthermore, according to the optical device 500, the precision of the lens diameter of a micro-lens 162 can be improved. Prior to the formation of the micro-lenses 162, the frames 501 are formed on the surface 141b. For example, the frames 501 can be formed by use of a photolithography technology. The micro-lenses 162 can be formed in the same way as in the second embodiment. Since the frames 501 exercise a wet pinning effect, the liquid energy-curable resin 165 provided inside the frames 501 are less likely to spread to the outside of the frames 501. Therefore, the planar shape of a micro-lens 162 can be controlled with high precision by the planar shape of a frame 501.

Furthermore, as with the optical device 300, a micro-lens 162 with a high light-collecting efficiency can be obtained with the optical device 500 as well.

Sixth Embodiment

Figure 13:
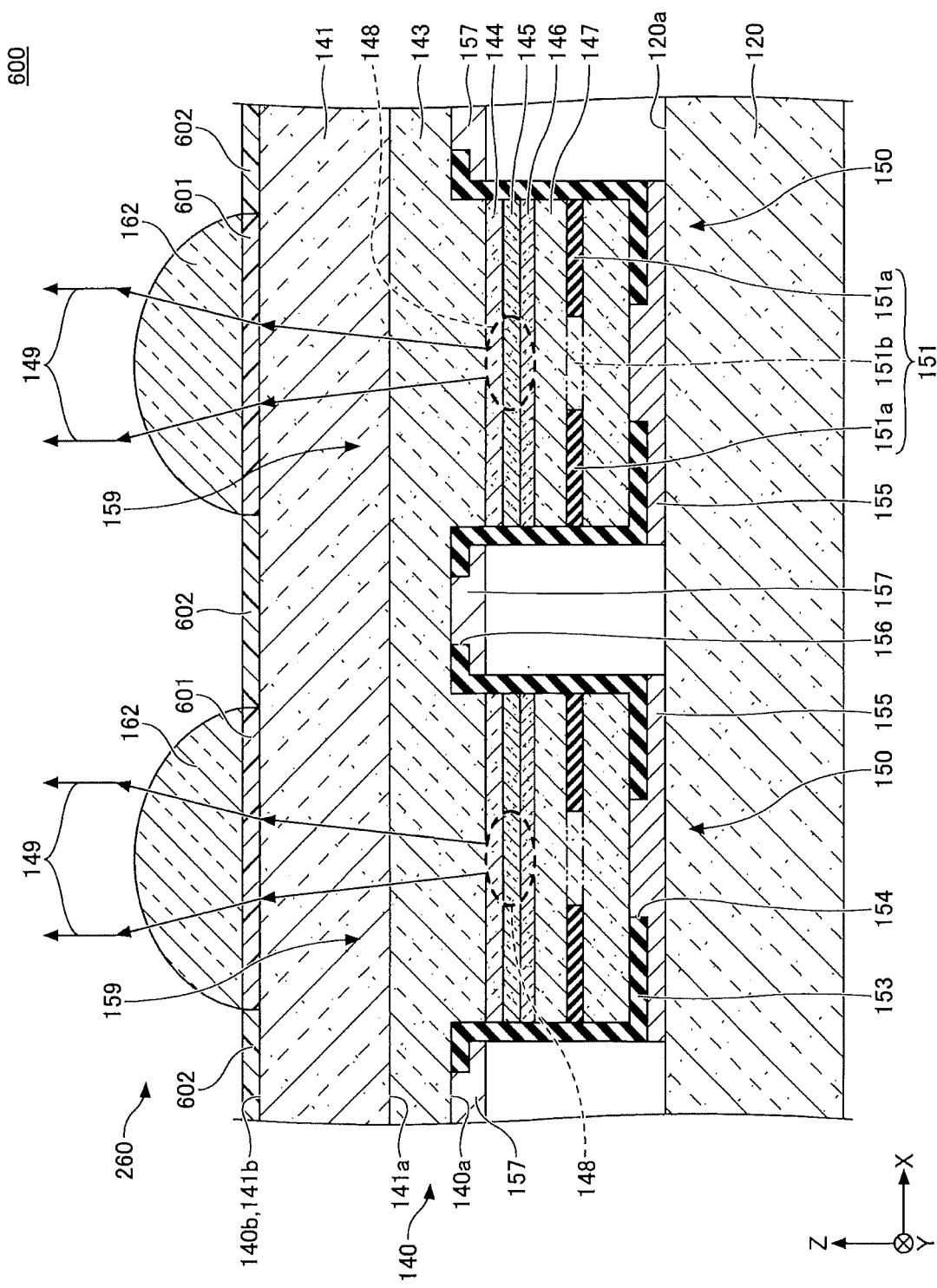
FIG. 13 is a cross-sectional view illustrating an optical device according to the sixth embodiment.

Next, description is given of the sixth embodiment. The sixth embodiment is different from the second embodiment in terms of the configuration of the periphery of a micro-lens. FIG. 13 is a cross-sectional view illustrating an optical device according to the sixth embodiment. FIG. 13 is a cross-sectional view taken along the line I-I in FIG. 1.

As illustrated in FIG. 13, the optical device 600 according to the sixth embodiment includes a first film 601 at a portion of the surface 141b where a micro-lens 162 is formed and a second film 602 around the first film 601. The surface free energy of a first film 601 is higher than the surface free energy of the surface 140b, and the surface free energy of a second film 602 is lower than the surface free energy of the surface 140b. Therefore, on the surface 140b (surface 141b), because of a first film 601 and a second film 602, the surface free energy of a portion overlapping a micro-lens 162 on a planar view is higher than the portion around the overlapping portion. The other aspects of the configuration are the same as those of the second embodiment.

The same effect as the optical device 200 can be obtained with the optical device 600 as well.

Furthermore, according to the optical device 600, the precision of the lens diameter of a micro-lens 162 can be improved. Prior to the formation of the micro-lenses 162, the first films 601 and the second films 602 are formed on the surface 141b. The micro-lenses 162 can be formed in the same way as in the second embodiment. The liquid energy-curable resin 165 provided on a first film 601 is less likely to spread to the outside of the first film 601. Therefore, the planar shape of a micro-lens 162 can be controlled with high precision by the planar shapes of a first film 601 and a second film 602.

Also, due to the difference in surface free energy, the contact angle of the liquid energy-curable resin 165 on the surface 141b is larger on a second film 602 than on a first film 601. Therefore, in a case where the amount of energy-curable resin 165 per micro-lens 162 is increased from that of the second embodiment, the curvature of the energy-curable resin 165 becomes larger. Therefore, it is also possible to obtain a micro-lens 162 with a large curvature, a strong refractive power, and a high light-collecting efficiency.

Figure 14:
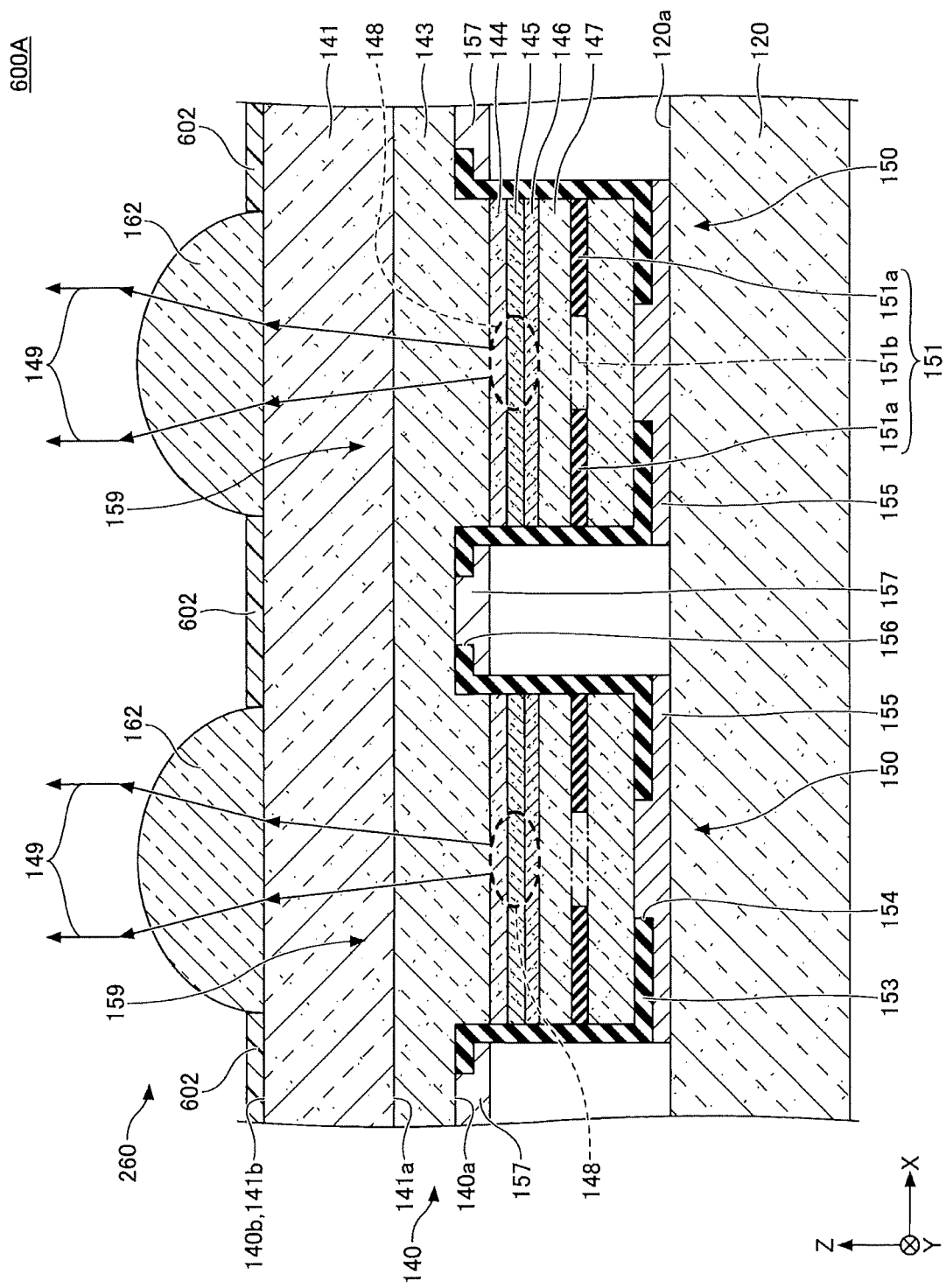
FIG. 14 is a cross-sectional view illustrating an optical device according to the first modification example of the sixth embodiment.
Figure 15:
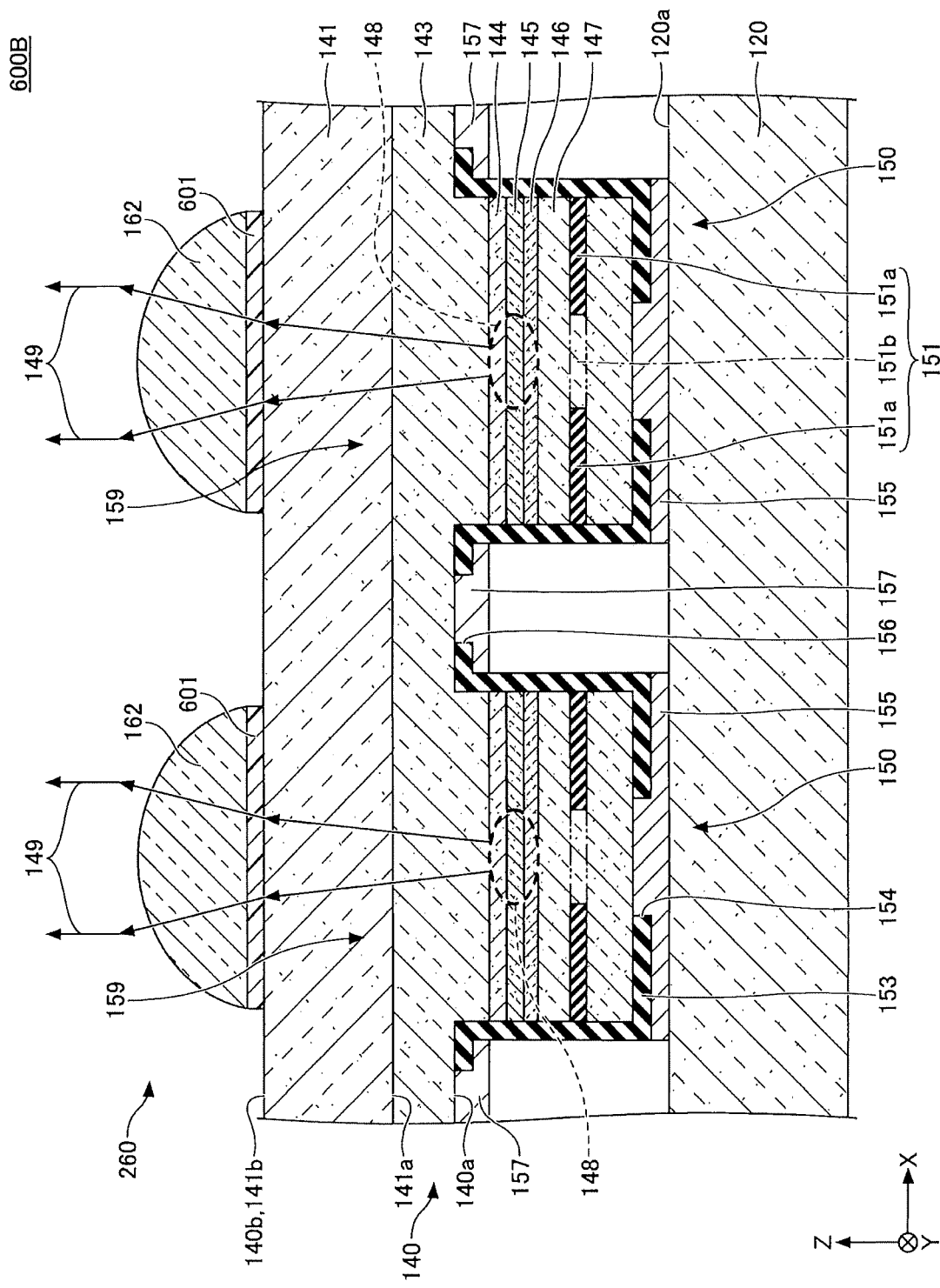
FIG. 15 is a cross-sectional view illustrating an optical device according to the second modification example of the sixth embodiment.

As illustrated in FIG. 14, first films 601 may not be provided, and, as illustrated in FIG. 15, second films 602 may not be provided. FIG. 14 is a cross-sectional view illustrating an optical device 600A according to the first modification example of the sixth embodiment. FIG. 15 is a cross-sectional view illustrating an optical device 600B according to the second modification example of the sixth embodiment. FIG. 14 and FIG. 15 are cross-sectional views taken along the I-I line in FIG. 1.

Seventh Embodiment

Figure 16:
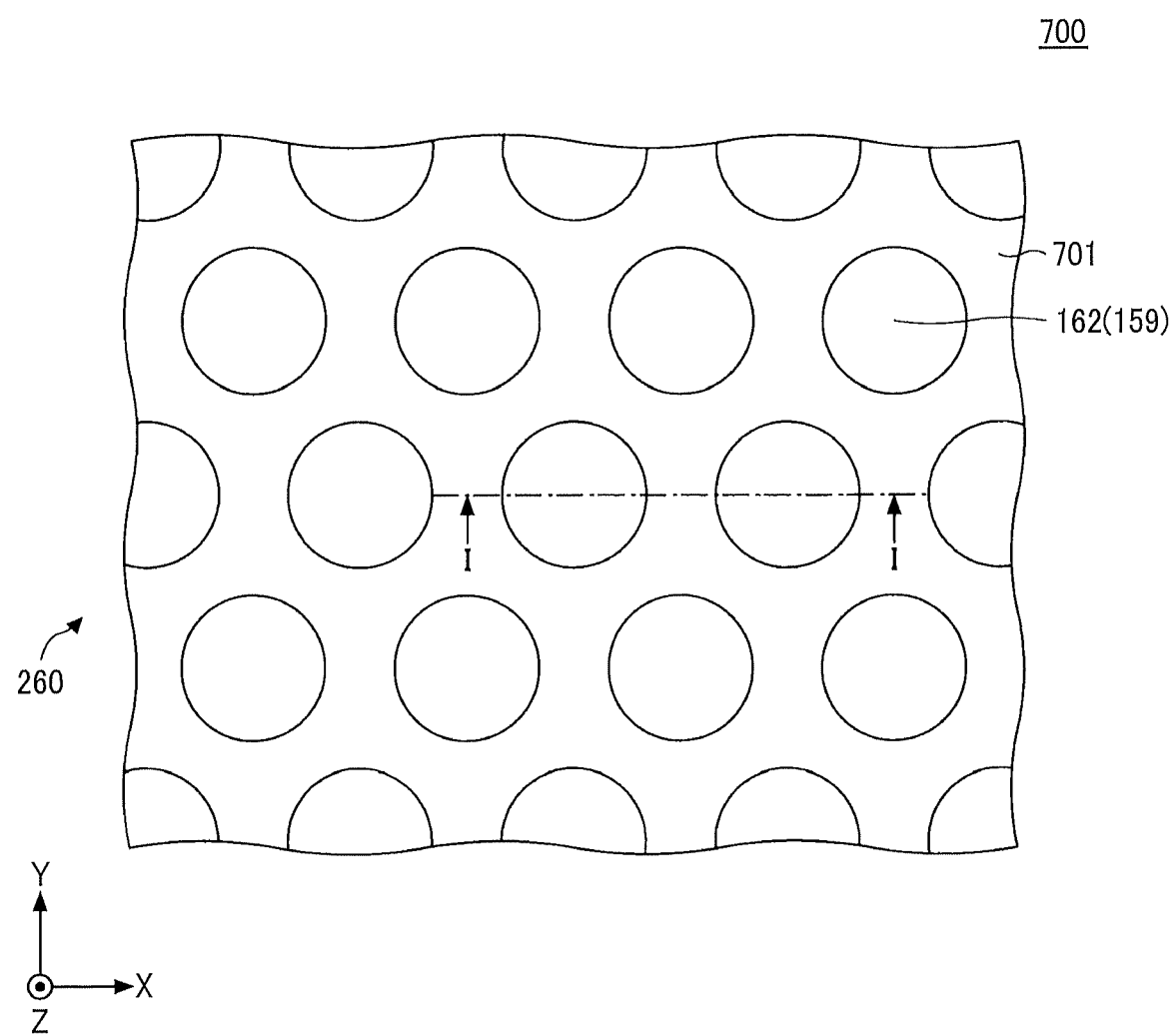
FIG. 16 is a plan view illustrating an optical device according to the seventh embodiment.
Figure 17:
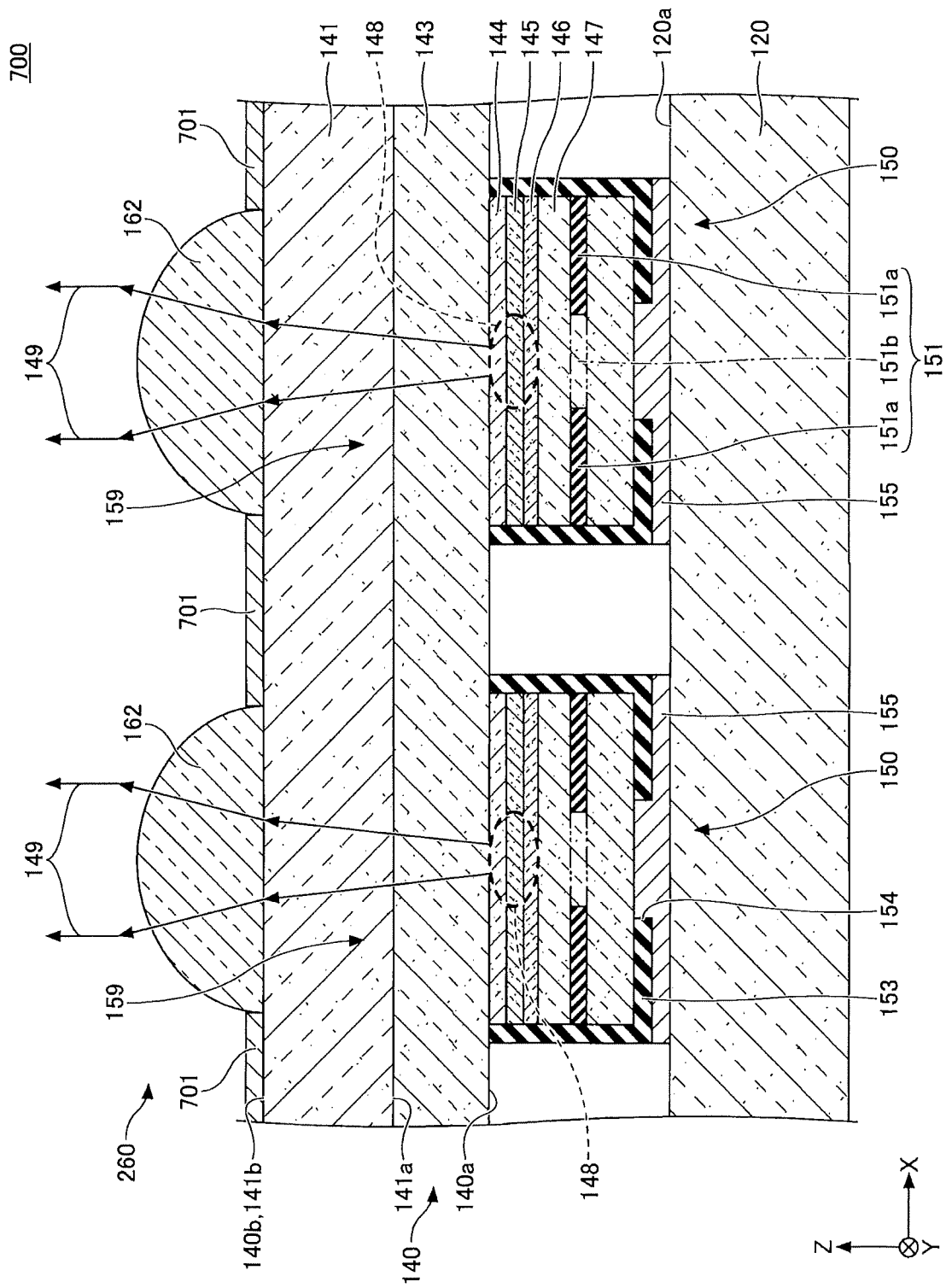
FIG. 17 is a cross-sectional view illustrating the optical device according to the seventh embodiment.

Next, description is given of the seventh embodiment. The seventh embodiment is different from the second embodiment in terms of the configuration of the periphery of a micro-lens. FIG. 16 is a plan view illustrating an optical device according to the seventh embodiment. FIG. 17 is a cross-sectional view illustrating the optical device according to the seventh embodiment. FIG. 17 is a cross-sectional view taken along the line I-I in FIG. 16.

As illustrated in FIG. 16 and FIG. 17, the optical device 700 according to the seventh embodiment includes an n-side electrode 701 around a portion of the surface 141b where a micro-lens 162 is formed. Furthermore, an opening 156 is not formed in the insulating layer 153, and an n-side electrode 157 is not provided. As the n-side electrode 701, for example, a laminated film in which AuGe, Ni, and Au are laminated in that order from the n-DBR 143 side can be used. The other aspects of the configuration are the same as those of the second embodiment.

The same effect as the optical device 200 can be obtained with the optical device 700 as well.

Furthermore, regarding the optical device 700, a voltage is applied to the VCSEL elements 159 from the n-side electrodes 701 and the p-side electrodes 155. Therefore, it is also possible to obtain an effect of improvement in terms of downsizing and layout.

Moreover, in a case where the material of an n-side electrode 701 has a light-shielding property against laser light 149, it is possible to suppress the emission of stray light from the emitting region 148.

As in the third embodiment, a concave portion 141d may be formed at a portion where an n-side electrode 701 is provided (see FIG. 10). As in the fourth embodiment, a convex portion 141f may be formed at a portion where an n-side electrode 701 is provided (see FIG. 11). As in the fifth embodiment, a frame 501 may be formed between an n-side electrode 701 and a micro-lens 162 (see FIG. 12). As in the sixth embodiment, a first film 601 may be formed at a portion of the surface 141b where a micro-lens 162 is formed, and a second film 602 may be formed on an n-side electrode 701 (see FIG. 13). As in the first modification example of the sixth embodiment, a first film 601 may not be provided (see FIG. 14), and, as in the second modification example of the sixth embodiment, a second film 602 may not be provided (see FIG. 15). Furthermore, the arrangement of the VCSEL elements 159 and the micro-lenses 162 is not limited. That is, a staggered arrangement (triangular lattice arrangement) illustrated in FIG. 16 or a square arrangement (square lattice arrangement) may be possible (see FIG. 7).

Eighth Embodiment

Figure 18:
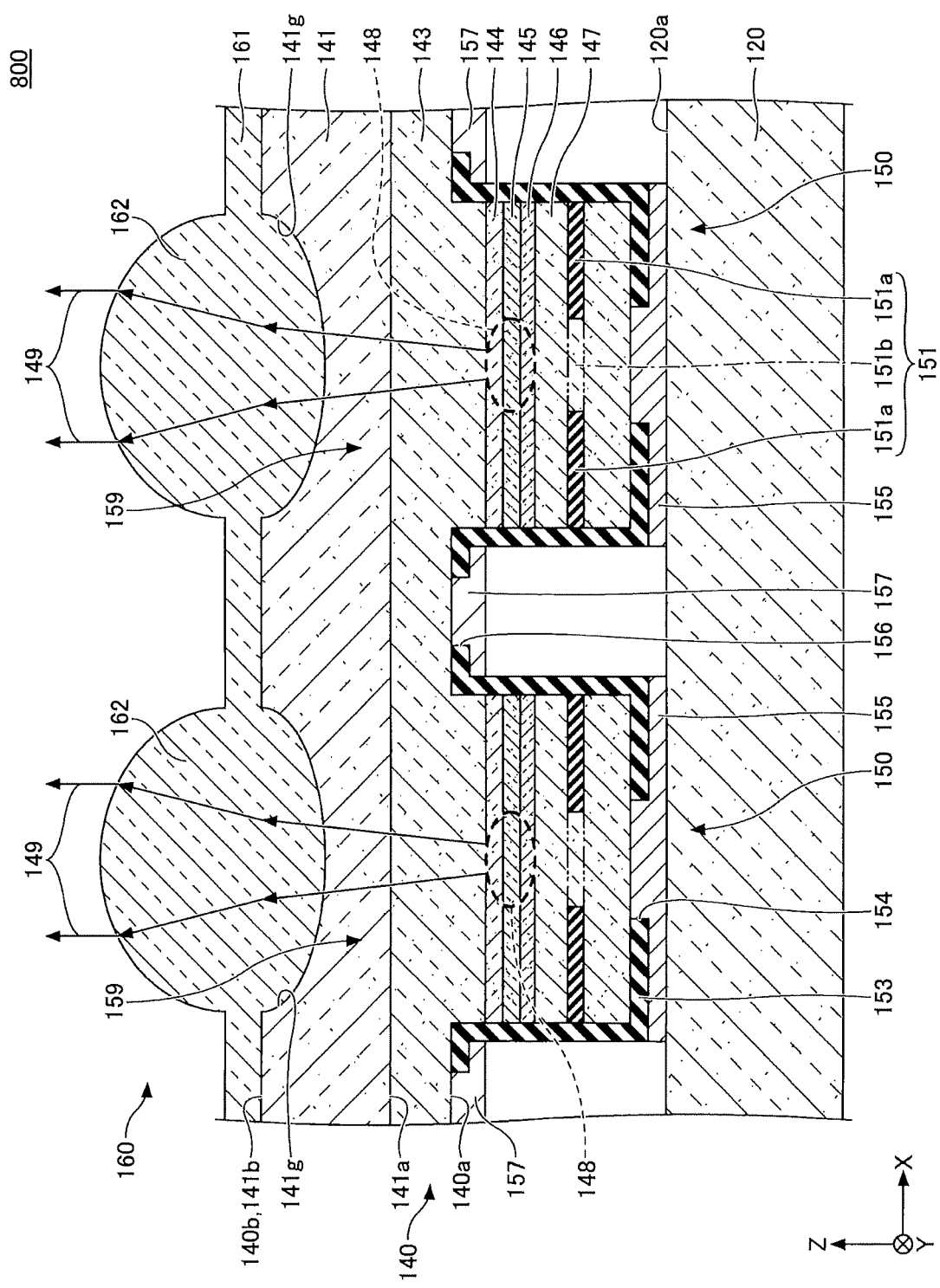
FIG. 18 is a cross-sectional view illustrating an optical device according to the eighth embodiment.

Next, description is given of the eighth embodiment. The eighth embodiment is different from the first embodiment in terms of the configuration of the substrate of the VCSEL chip. FIG. 18 is a cross-sectional view illustrating an optical device according to the eighth embodiment. FIG. 18 is a cross-sectional view taken along the line I-I in FIG. 1.

As illustrated in FIG. 18, in the optical device 800 according to the eighth embodiment, a concave lens structure 141g is formed at a portion of the surface 141b where a micro-lens 162 is formed. Although the thickness of the substrate 141 is approximately 200 µm in the first embodiment, the thickness of the substrate 141 is approximately 100 µm in the eighth embodiment. In addition, the lens diameter of a micro-lens 162 is 40 µm and the curvature radius is 50 µm. The height (sag amount) from the flat surface of the surface 140b around a concave lens structure 141g to the top of a micro-lens 162 is approximately 3 µm. The other aspects of the configuration are the same as those of the first embodiment.

The same effect as the optical device 100 can be obtained with the optical device 800 as well.

Furthermore, since a concave lens structure 141g is formed, laser light 149 spreads inside a micro-lens 162 more, compared to the first embodiment. Therefore, the light-collecting efficiency by the micro-lens 162 can be enhanced. That is, according to the optical device 800, the emission angle can be reduced.

To manufacture the optical device 800, the concave lens structures 141g are formed on the surface 141b before the formation of the anti-reflection structure 163, so that the anti-reflection structure 163 is formed on the surface 141b including the concave lens structures 141g. A sub-wavelength structure or an anti-reflection film may be formed as the anti-reflection structure 163. Then, as in the first embodiment, the process of application of an energy-curable resin 165 that is liquid at room temperature and the subsequent processes are performed. The mold 169 for forming the micro-lenses 162 with the lens diameter of 40 µm and the curvature radius of 50 µm can be easily prepared. Therefore, a micro-lens 162 with a high light-collecting efficiency can be easily manufactured with high dimensional precision of the lens diameter, etc.

Ninth Embodiment

Figure 19:
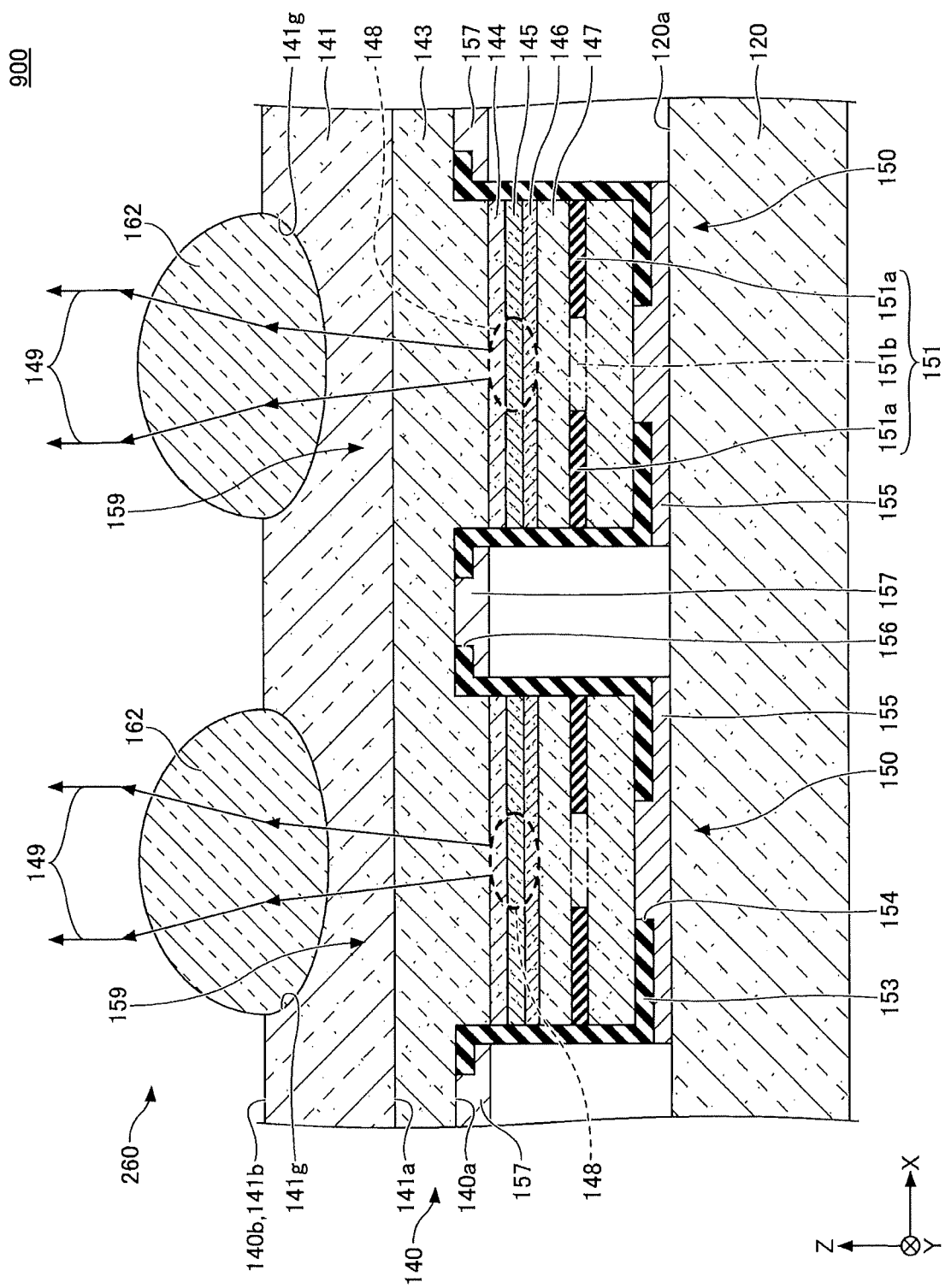
FIG. 19 is a cross-sectional view illustrating an optical device according to the ninth embodiment.

Next, description is given of the ninth embodiment. The ninth embodiment is different from the second embodiment in terms of the configuration of the substrate of the VCSEL chip. FIG. 19 is a cross-sectional view illustrating an optical device according to the ninth embodiment. FIG. 19 is a cross-sectional view taken along the line I-I in FIG. 1.

As illustrated in FIG. 19, in the optical device 900 according to the ninth embodiment, a concave lens structure 141g is formed at a portion of the surface 141b where a micro-lens 162 is formed, as in the eighth embodiment. The other aspects of the configuration are the same as those of the second embodiment.

According to the optical device 900, the same effect as the optical device 800 and the same effect as the optical device 200 can be obtained.

To manufacture the optical device 900, the concave lens structures 141g are formed on the surface 141b before the formation of the anti-reflection structure 163, so that the anti-reflection structure 163 is formed on the surface 141b including the concave lens structures 141g. A sub-wavelength structure or an anti-reflection film may be formed as the anti-reflection structure 163. Then, as in the second embodiment, the process of ejection of an energy-curable resin 165 that is liquid at room temperature and the subsequent processes are performed. In this manufacturing method, the concave lens structures 141g can exercise a pinning effect that suppresses spreading of the energy-curable resin 165. Therefore, the precision of the lens diameter of the micro-lenses 162 can be improved.

Tenth Embodiment

Figure 20:
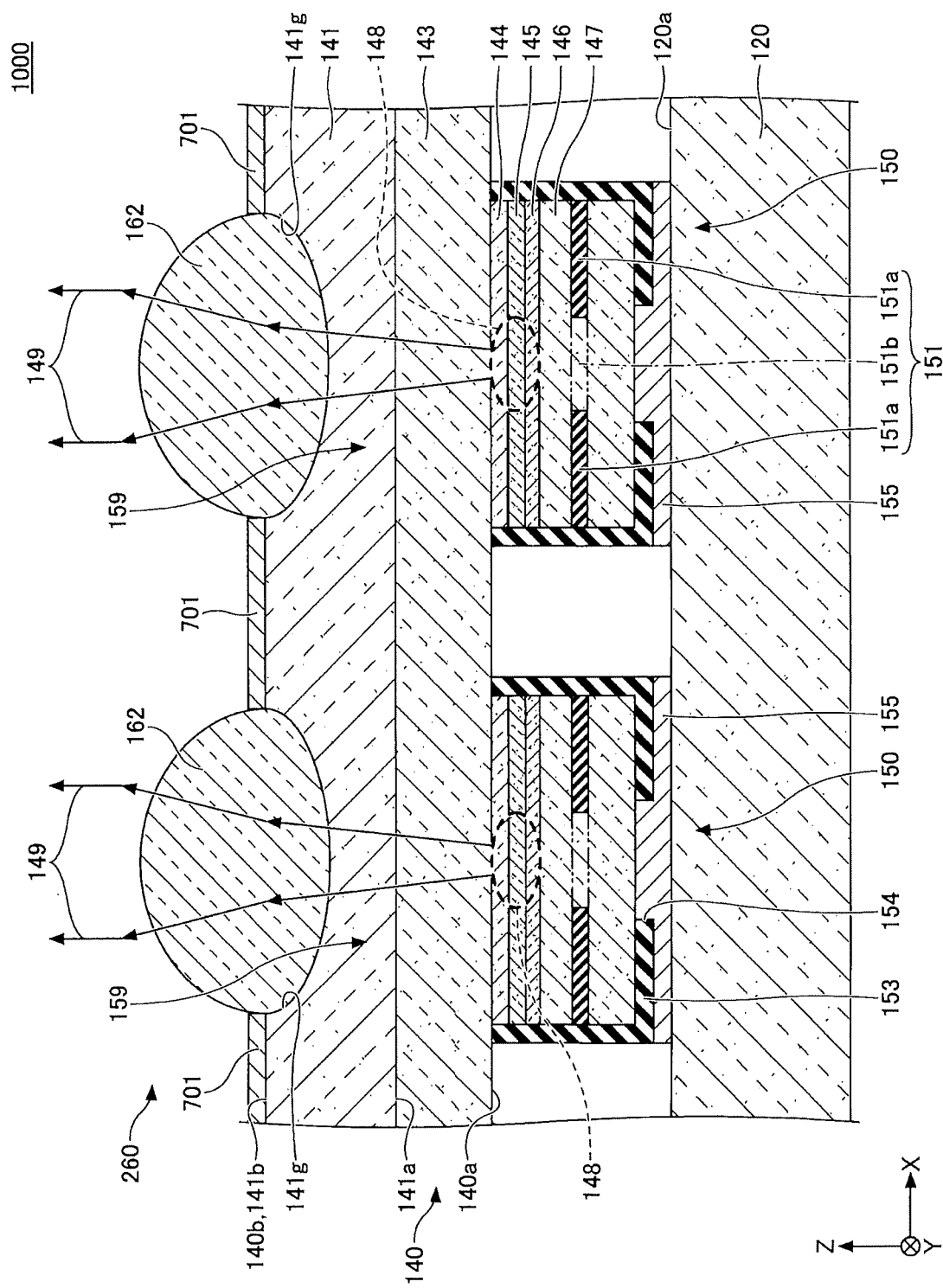
FIG. 20 is a cross-sectional view illustrating an optical device according to the tenth embodiment.

Next, description is given of the tenth embodiment. The tenth embodiment is different from the ninth embodiment in terms of the configuration of the periphery of a micro-lens. FIG. 20 is a cross-sectional view illustrating an optical device according to the tenth embodiment. FIG. 20 is a cross-sectional view taken along the line I-I in FIG. 1.

As illustrated in FIG. 20, in the optical device 1000 according to the tenth embodiment, a concave lens structure 141g is formed at a portion of the surface 141b where a micro-lens 162 is formed, as in the ninth embodiment. The other aspects of the configuration are the same as those of the seventh embodiment.

According to the optical device 1000, the same effect as the optical device 900 and the same effect as the optical device 700 can be obtained.

In the ninth embodiment and the tenth embodiment, a frame 501 may be formed as in the fifth embodiment (see FIG. 12). As in the sixth embodiment, a first film 601 and a second film 602 may be formed (see FIG. 13). As in the first modification example of the sixth embodiment, a first film 601 may not be provided (see FIG. 14), and, as in the second modification example of the sixth embodiment, a second film 602 may not be provided (see FIG. 15).

In the first embodiment through the tenth embodiment, it is also possible that an anti-reflection film is formed on the top surface of a micro-lens 162.

Eleventh Embodiment

Figure 21:
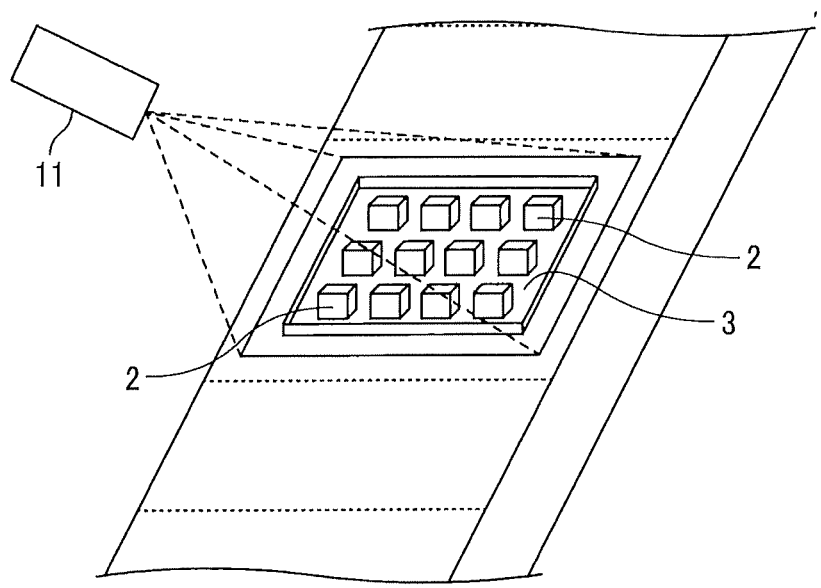
FIG. 21 is a diagram illustrating a usage example of a measuring apparatus according to the eleventh embodiment.

Next, description is given of the eleventh embodiment. The eleventh embodiment relates to a measuring apparatus including the optical device according to any one of the first embodiment through the tenth embodiment. FIG. 21 is a diagram illustrating a usage example of the measuring apparatus according to the eleventh embodiment.

Figure 26:
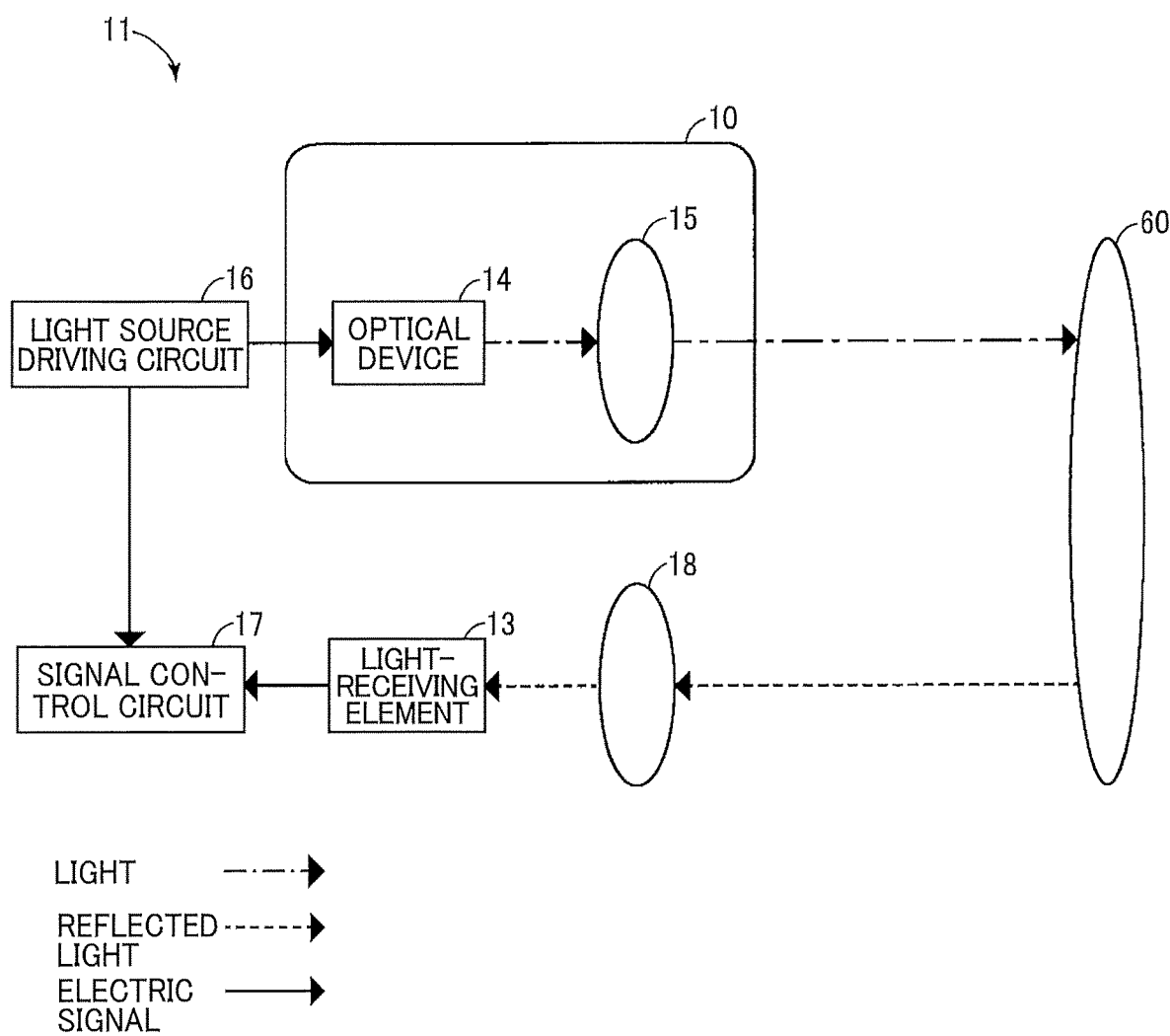
FIG. 26 is a schematic block diagram illustrating a measuring apparatus according to an embodiment.

As illustrated in FIG. 21, for example, the measuring apparatus 11 according to the eleventh embodiment can be used for an appearance inspection of the parts 2 in a factory, etc. As illustrated in FIG. 26, for example, the measuring apparatus 11 includes a lighting unit 10, which is provided with an optical device 14 including the VCSEL chip 140 according to any one of the first embodiment through the tenth embodiment, and a light-receiving element 13, which is configured with a photoelectric conversion element such as an optical sensor. The lighting unit 10 includes a projecting unit 15 (projecting device) for projecting the light emitted by a VCSEL element 159 through a micro-lens 162 to the irradiated surface, as the irradiated region 60. The projecting unit 15 is configured with an optical system for expanding the light emitted by the optical device 14 and projecting the light to the target object 3 (in this example, the surface on which the parts 2 are disposed). As an example, the measuring apparatus 11 is a distance-detecting apparatus in a time-of-flight (TOF) system, which projects (irradiates) pulse light from the lighting unit 10 to the target object (detection target) 3 (the parts 2), and receives the reflected light from the target object 3 by use of the light-receiving element (optical sensor) 13, so that the distance to the target object 3 is measured based on the time needed to receive the reflected light. In the optical device 14 of the lighting unit 10, light emission is controlled by a current transmitted by the light source driving circuit 16. The light source driving circuit 16 transmits a signal to the signal control circuit 17 in a case where the optical device 14 is controlled to emit light. The reflected light reflected by the target object 3 after being projected from the optical device 14 is guided to the light-receiving element 13 through the light-receiving optical system 18 having a light-collecting function. The light received by the light-receiving element 13 is converted to an electric signal in photoelectric conversion, so as to be transmitted to the signal control circuit 17. The signal control circuit 17 calculates the distance to the target object 3, based on the time difference between the light projection (input of the emission signal from the light source driving circuit 16) and the light reception (input of the reception signal from the light-receiving element 13). Therefore, in the measuring apparatus 11, the light-receiving element 13 functions as a detecting unit for detecting the light emitted by the optical device 14 and reflected by the target object 3. Furthermore, the signal control circuit 17 functions as a calculating unit for obtaining information relating to the distance to the target object 3, based on a signal from the light-receiving element (detecting unit) 13. Note that, in the example of FIG. 21, it is possible to obtain depth information of the parts 2 by use of the measuring apparatus 11. Therefore, information such as subtle scratches, defects, and three-dimensional shapes, can be easily obtained, compared to an appearance inspection by use of a normal camera. In addition, since the measuring apparatus 11 is provided with a lighting unit, the measuring apparatus 11 can be used even in a dark environment. Furthermore, since the lighting unit includes the VCSEL chip 140, lighting can be evenly performed. Accordingly, by use of the lighting unit, the distance measurement precision is not deteriorated in the area around the optical sensor even though light is irradiated at a wide angle. Thus, an inspection can be performed on a number of parts 2 at once, and, therefore, the work efficiency is expected to be improved. The lighting unit is an example of a lighting apparatus, and the optical sensor is an example of an imaging unit.

As an example, the measuring apparatus 11 in FIG. 21 functions as a part-inspecting apparatus provided with an inspecting unit that performs an appearance inspection of a target object, based on information obtained by the measuring apparatus 11. In this case, the signal control circuit 17 functions as the inspecting unit.

Twelfth Embodiment

Figure 22:
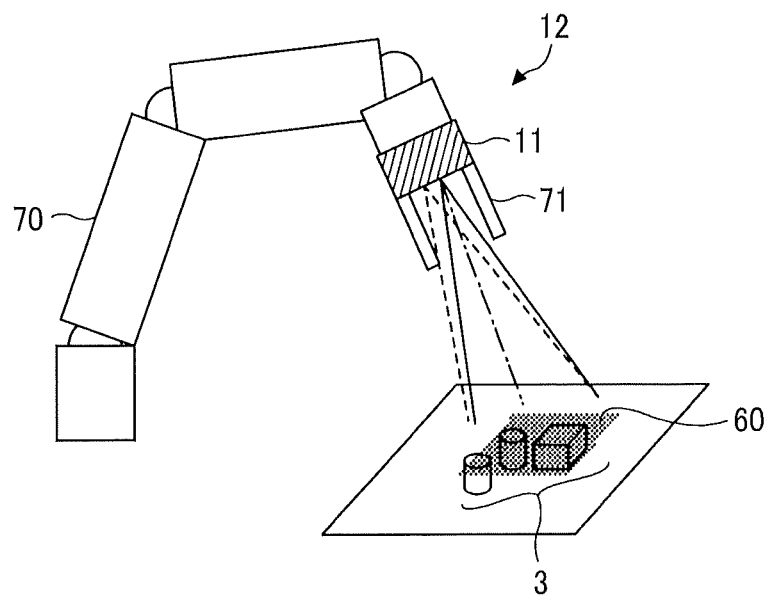
FIG. 22 is a diagram illustrating a robot according to the twelfth embodiment.

Next, description is given of the twelfth embodiment. The twelfth embodiment relates to a robot including the measuring apparatus according to the eleventh embodiment. FIG. 22 is a diagram illustrating a robot according to the twelfth embodiment.

As illustrated in FIG. 22, the robot 12 according to the twelfth embodiment includes the robot arm (multi joint arm) 70 having multiple joints, the hand unit 71 for picking a target object, the measuring apparatus 11 mounted in the vicinity of the hand unit 71. The robot arm 70 includes multiple movable units, each of which is able to bend, so that the hand unit 71 is controlled to change the position and the orientation thereof.

The measuring apparatus 11 is provided so that the direction of light projection matches the direction of the orientation of the hand unit 71, and the measuring apparatus 11 measures the target object 3 to be picked by the hand unit 71 as the measurement target. In the measurement, the measuring apparatus 11 irradiates the irradiation region 60 with laser light from a built-in optical device. More particularly, the light-receiving element 13 of the measuring apparatus 11 receives reflected light from the irradiation region, which includes the target object 3, and the signal control circuit 17 generates image data (imaging is performed) and determines various kinds of information related to the target object 3, based on the obtained image information. Specifically, the information detected by use of the measuring apparatus 11 is the distance to the target object 3, the shape of the target object 3, the position of the target object 15, the positional relationship between multiple target objects 3 if any, or the like. Furthermore, based on the determination result of the signal control circuit 17, operations of the robot arm 70 and the hand unit 71 are controlled, so as to grasp or move the target object 3, etc.

As described above, in the twelfth embodiment, by mounting the measuring apparatus 11 on the robot arm 70, it is possible to measure the target object 3 to be picked from a short distance. Therefore, compared to measurement from a long distance by use of a camera, or the like, improvement of measurement precision and recognition precision can be achieved. For example, in the field of factory automation (FA) in various assembly lines of factories, the robot 12 including the robot arm 70 is utilized in order to inspect or recognize parts, which are the target objects 3. By mounting the measuring apparatus 11 on the robot 12, inspection or recognition of the parts can be performed with high precision.

The optical device according to any of the first embodiment through the tenth embodiment may not be mounted inside the measuring apparatus 11, and the optical device may be mounted in the vicinity of the hand unit 71 independently from the measuring apparatus 11.

Thirteenth Embodiment

Figure 23:
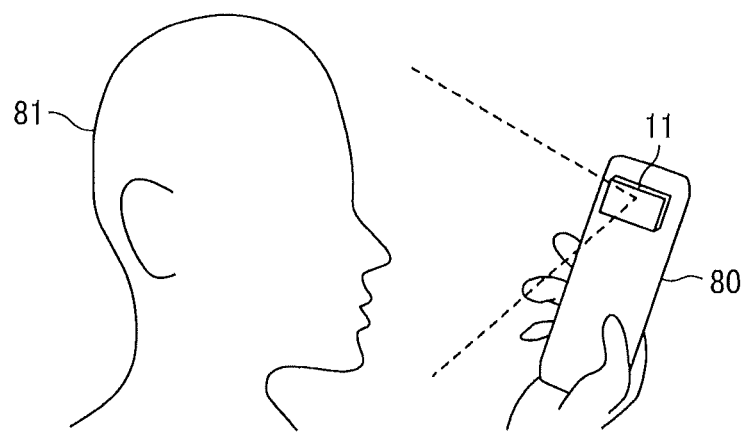
FIG. 23 is a diagram illustrating an electronic device according to the thirteenth embodiment.

Next, description is given of the thirteenth embodiment. The thirteenth embodiment relates to an electronic device mounted with the measuring apparatus according to the eleventh embodiment. FIG. 23 is a diagram illustrating an electronic device according to the thirteenth embodiment.

For example, the electronic device according to the thirteenth embodiment is the smartphone 80. The smartphone 80 is mounted with the measuring apparatus 11 and a control unit for performing authentication of a user. For example, the control unit for performing authentication of a user is dedicated hardware. Alternatively, it is possible that a central processing unit (CPU) having a computer configuration executes a program stored in a read only memory (ROM), or the like, so as to implement the authentication function. The measuring apparatus 11 measures the shape of the face, ears, head, or the like, of the user 81. Based on the measurement result, the control unit for executing authentication of a user determines whether the user 81 is a person who is registered in the smartphone 80 or not. For the authentication of a user, light is projected from the optical device 14 (lighting unit 10) of the measuring apparatus 11 mounted on the smartphone 80 toward the user 81 who uses the smartphone 80. The light reflected by the user 81 and the surroundings is received by the light-receiving element 13 of the measuring apparatus 11, so that image data is generated (imaging is performed) by the signal control circuit 17, which functions as an image-processing unit. The signal control circuit 17 determines whether the user 81 is a registered user or not, based on the degree of coincidence between the image information of the user 81 and preregistered user information. Specifically, the shape (outline, concavity and convexity, etc.) of the face, ears, head, or the like, of the user 81 is measured, so as to be used as the user information.

As described above, in the thirteenth embodiment, by mounting the measuring apparatus 11 on the smartphone 80, the shape of the face, ears, head, or the like, of the user 81 can be measured with high precision, so that recognition precision can be improved. Note that, although the measuring apparatus 11 is mounted on the smartphone 80 in the present embodiment, the measuring apparatus 11 may be mounted on an electronic device such as a personal computer (PC) or a printer. Furthermore, the function is not limited to such a person authentication function and may be used for scanning of the shape of a face, etc.

The optical device according to any of the first embodiment through the tenth embodiment may not be mounted inside the measuring apparatus 11, and the optical device may be mounted on an electronic device, such as the smartphone 80, independently from the measuring apparatus 11.

Fourteenth Embodiment

Figure 24:
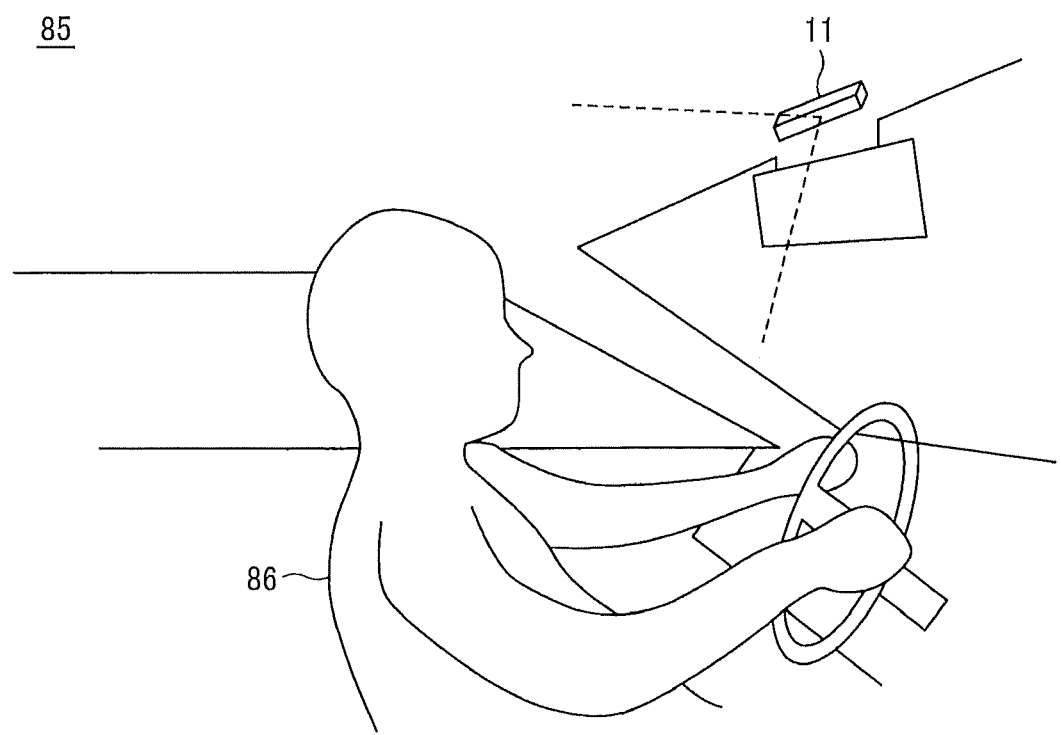
FIG. 24 is a diagram illustrating a movable object according to the fourteenth embodiment.

Next, description is given of the fourteenth embodiment. The fourteenth embodiment relates to a movable object, such as a vehicle, which is mounted with the measuring apparatus 11 according to the eleventh embodiment. FIG. 24 is a diagram illustrating the inside of a movable object according to the fourteenth embodiment.

As illustrated in FIG. 24, the movable object according to the fourteenth embodiment is, for example, an automobile. The measuring apparatus 11 and a control unit for providing a driving support function are mounted in the interior 85 of the automobile. For example, the control unit is dedicated hardware. Alternatively, it is possible that a CPU having a computer configuration executes a program stored in a ROM, or the like, so as to implement the driving support function. The measuring apparatus 11 measures the face, posture, or the like, of the driver 86. Based on the measurement result, the control unit for executing driving support provides appropriate support in accordance with the situation of the driver 86. Light is projected from the optical device 14 (lighting unit 10) of the measuring apparatus 11 mounted in the interior 85 of the automobile toward the driver 86 who is driving the automobile. The light reflected by the driver 86 and the surroundings is received by the light-receiving element 13 of the measuring apparatus 11, so that image data is generated (imaging is performed) by the signal control circuit 17. The signal control circuit 17 determines information such as the face (facial expression), posture, or the like, of the driver 86, based on the image information of the driver 86. Then, based on the determination result of the signal control circuit 17, the brakes, the steering wheel, or the like, are controlled, so as to provide appropriate driving support in accordance with the situation of the driver 86. For example, it is possible that automatic deceleration control, automatic stopping control, or the like, can be performed in a case where, for example, inattentive driving, drowsy driving, or the like, is detected.

As described above, in the fourteenth embodiment, by mounting the measuring apparatus 11 in an automobile, the face, posture, or the like, of the driver 86 can be measured with high precision, and recognition precision of the situation of the driver 86 in the interior 85 can be improved. Note that, although the measuring apparatus 11 is mounted in an automobile in the present embodiment, the measuring apparatus 11 may be mounted in the interior of a train, in the cockpit (or a passenger seat) of an airplane, or the like. Furthermore, the function is not limited to recognition of the situation of the driver 86, such as the face, posture, or the like, of the driver 86, and may be used for recognition of the situation of a passenger other than the driver 86 and the situation of the interior 85, etc. Moreover, the function may be used for security of an automobile in such a way as performing person authentication of the driver 86 and determining whether the driver 86 is preregistered as a driver of the automobile or not.

The optical device according to any of the first embodiment through the tenth embodiment may not be mounted inside the measuring apparatus 11, and the optical device may be mounted in the interior 85 independently from the measuring apparatus 11.

Fifteenth Embodiment

Figure 25:
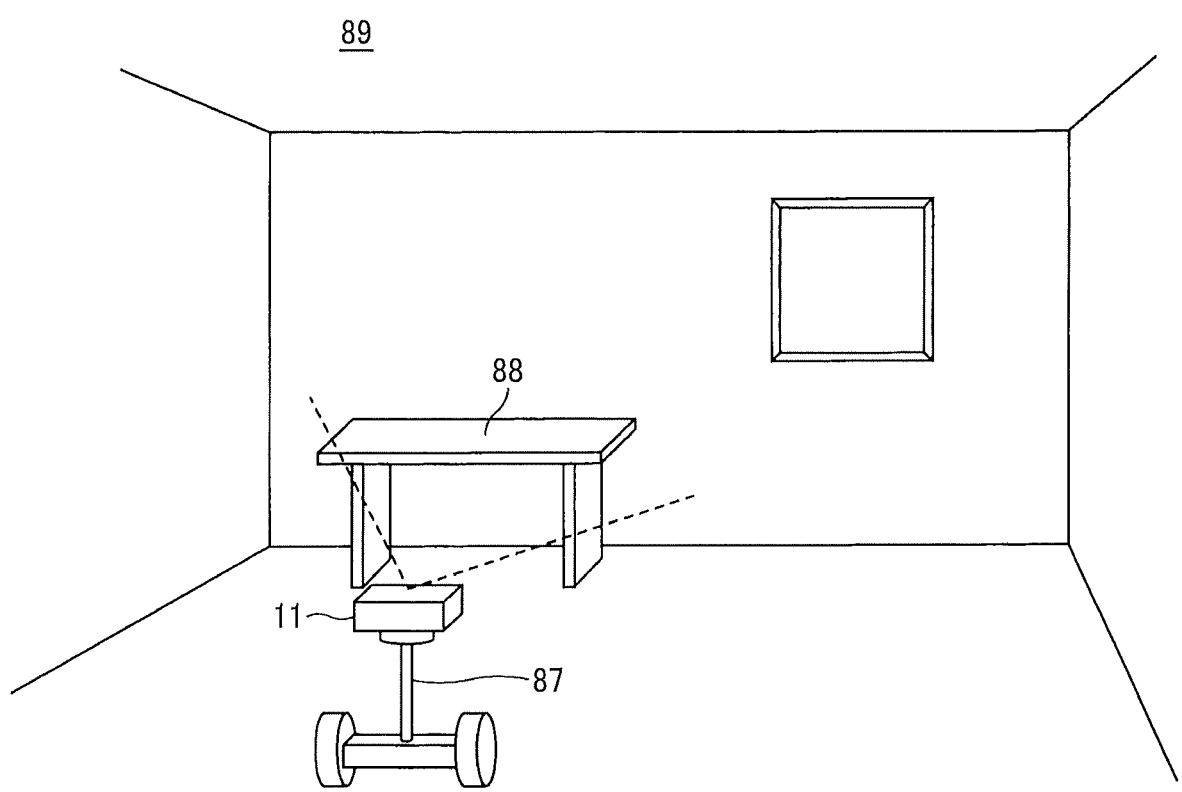
FIG. 25 is a diagram illustrating a movable object according to the fifteenth embodiment.

Next, description is given of the fifteenth embodiment. The fifteenth embodiment relates to a movable object mounted with the measuring apparatus 11 according to the eleventh embodiment. FIG. 25 is a diagram illustrating a movable object according to the fifteenth embodiment.

As illustrated in FIG. 25, the movable object 87 according to the fifteenth embodiment is, for example, an autonomous movable object. The measuring apparatus 11 is mounted on the movable object 87, and the measuring apparatus 11 measures the surroundings of the movable object 87. Based on the measurement result, the movable object 87 determines its own moving route and calculates the layout of the room 89, such as the position of the desk 88. The measuring apparatus 11 mounted on the movable object 87 irradiates the moving direction of the movable object 87 and the surrounding region with light. In the room 89, which is the moving area of the movable object 87, a desk 88 is placed in the moving direction of the movable object 87. Of the light projected from the optical device 14 (lighting unit 10) of the measuring apparatus 11 mounted on the movable object 87, the light reflected by the desk 88 and the surroundings is received by the light-receiving element 13 of the measuring apparatus 11 and converted to an electric signal in photoelectric conversion, so as to be transmitted to the signal control circuit 17. Based on the electric signal, etc., transmitted from the light-receiving element 13, the signal control circuit 17 calculates information related to the layout of the room 89, such as the distance to the desk 88, the position of the desk 88, or the situation of the surroundings other than the desk 88. Based on the calculated information, the signal control circuit 17 determines the moving route, moving speed, or the like, of the movable object 87, and, based on the determination result, running (an operation of a motor that is the driving source, etc.) of the movable object 87 is controlled.

As described above, in the fifteenth embodiment, by mounting the measuring apparatus 11 on the movable object 87, the surroundings of the movable object 87 can be measured with high precision, so that driving support of the movable object 87 is possible. Note that the measuring apparatus 11 is mounted on the small-sized movable object 87 in the present embodiment, the measuring apparatus 11 may be mounted on an automobile, or the like. In addition, not only indoors, the measuring apparatus 11 may be also used outdoors for such a purpose as measuring buildings, or the like.

The optical device according to any of the first embodiment through the tenth embodiment may not be mounted inside the measuring apparatus 11, and the optical device may be mounted on the movable object 87 independently from the measuring apparatus 11. Regarding the optical device according to at least one of the above-described embodiments, it is possible to reduce the thickness thereof and reduce the emission angle of laser light at the same time.

The above-described embodiments are illustrative and do not limit the present invention. Thus, numerous additional modifications and variations are possible in light of the above teachings. For example, elements and/or features of different illustrative embodiments may be combined with each other and/or substituted for each other within the scope of the present invention.

Any one of the above-described operations may be performed in various other ways, for example, in an order different from the one described above.

Each of the functions of the described embodiments may be implemented by one or more processing circuits or circuitry. Processing circuitry includes a programmed processor, as a processor includes circuitry. A processing circuit also includes devices such as an application specific integrated circuit (ASIC), digital signal processor (DSP), field programmable gate array (FPGA), and conventional circuit components arranged to perform the recited functions.

The invention claimed is:

1. An optical device comprising:
    a substrate having a first surface and a second surface opposite of the first surface;
    a plurality of surface emitting laser elements provided on the first surface of the substrate and configured to emit light in a direction intersecting the first surface;
    a plurality of optical elements disposed on the second surface so as to respectively correspond to the plurality of surface emitting laser elements; and
    an anti-reflection structure between the substrate and the plurality of optical elements, the anti-reflection structure includes at least one of (i) a structure including a region portion through which the light from each of the plurality of surface emitting laser elements passes, the region portion having an average refractive index that continuously changes in a thickness direction of the region portion, or (ii) an anti-reflection film including a laminated film composed of a plurality of films.

2. The optical device according to claim 1, wherein the anti-reflection structure includes a sub-wavelength structure.

3. The optical device according to claim 1, wherein the plurality of optical elements are separated from each other on a planar view.

4. The optical device according to claim 1, wherein the plurality of optical elements include a resin material.

5. The optical device according to claim 1, wherein the second surface includes a step formed between portions overlapping the plurality of optical elements and a surrounding portion of the portions on a planar view.

6. The optical device according to claim 1, further comprising a film that enhances surface free energy, so that, on the second surface, surface free energy of portions overlapping the plurality of optical elements on a planar view is made higher than surface free energy of a surrounding portion of the portions.

7. The optical device according to claim 1, wherein the second surface includes a light-shielding member that covers a surrounding portion of portions overlapping the plurality of optical elements on a planar view.

8. The optical device according to claim 1, wherein the second surface includes a conductive member that covers a surrounding portion of portions overlapping the plurality of optical elements on a planar view.

9. The optical device according to claim 1, wherein, on the second surface, a plurality of concave lenses are respectively formed at portions overlapping the plurality of optical elements on a planar view.

10. A lighting apparatus comprising:
    the optical device according to claim 1; and
    a projecting device configured to project light to an irradiated surface, the light being emitted by the plurality of surface emitting laser elements through the plurality of optical elements.

11. A measuring apparatus comprising:
    the lighting apparatus according to claim 10;
    an imaging unit configured to image the light projected to the irradiated surface; and
    circuitry configured to measure a target object on the irradiated surface, based on image information of the light imaged by the imaging unit.

12. A part-inspecting apparatus comprising the measuring apparatus according to claim 11, wherein the circuitry outputs a result of an appearance inspection of the target object, based on a result of measurement of the target object.

13. A robot comprising: a multi joint arm; and the measuring apparatus according to claim 11, wherein the measuring apparatus is attached to the multi joint arm.

14. An electronic device comprising the measuring apparatus according to claim 11, wherein the circuitry performs authentication of a user of the measuring apparatus, based on a result of measurement of the target object.

15. A movable object comprising:
    the measuring apparatus according to claim 11; and
    circuitry configured to support driving of the movable object based on a result of measurement by the measuring apparatus.

16. The optical device according to claim 1, wherein the anti-reflection structure has a triangular cross-section shape.

17. The optical device according to claim 4, wherein the resin material is an energy-curable resin.

18. The optical device according to claim 1, wherein the anti-reflection structure includes a sub-wavelength structure, wherein the second surface of the substrate includes
    a first surface portion on which the sub-wavelength structure is disposed, and
    a second surface portion on which the sub-wavelength structure is not disposed, the second surface portion surrounding each of the plurality of optical elements, and
wherein each optical element includes a resin material.

* * * * *